United States Patent
Wu

(10) Patent No.: US 12,470,215 B2
(45) Date of Patent: Nov. 11, 2025

(54) OFF-CHIP DRIVER AND DRIVING CIRCUIT FOR PROVIDING MATCHING RESISTANCE VALUE

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 84 days.

(21) Appl. No.: 18/493,817

(22) Filed: Oct. 25, 2023

(65) Prior Publication Data

US 2025/0141449 A1 May 1, 2025

(51) Int. Cl.
*H03K 19/017* (2006.01)
*G06F 13/40* (2006.01)

(52) U.S. Cl.
CPC ....... *H03K 19/01721* (2013.01); *G06F 13/40* (2013.01)

(58) Field of Classification Search
CPC ....... H03K 19/01721; H03K 19/01742; H03K 19/0005; H03K 19/017545; H03K 19/01825; H03K 19/018557; H03K 19/018564; H03K 19/018571; H03K 19/01831; G06F 13/4086; H05K 1/0246
See application file for complete search history.

(56) References Cited

U.S. PATENT DOCUMENTS

| | | | |
|---|---|---|---|
| 5,602,494 A | 2/1997 | Sundstrom | |
| 6,281,709 B1 | 8/2001 | Seyyedy | |
| 6,573,753 B1 | 6/2003 | Snyder | |
| 10,103,731 B2 | 10/2018 | Hardee | |
| 10,637,474 B1 | 4/2020 | Wu | |
| 2003/0042573 A1* | 3/2003 | Fan | H10D 84/811 257/536 |
| 2003/0112042 A1 | 6/2003 | Takahashi | |
| 2005/0024090 A1 | 2/2005 | Terletzki et al. | |
| 2011/0242916 A1 | 10/2011 | Seol et al. | |

FOREIGN PATENT DOCUMENTS

| | | |
|---|---|---|
| TW | 200713270 | 4/2007 |
| TW | 202103164 | 1/2021 |

OTHER PUBLICATIONS

"Office Action of Taiwan Counterpart Application", issued on Feb. 10, 2025, p. 1-p. 5.

* cited by examiner

*Primary Examiner* — Jung Kim
(74) *Attorney, Agent, or Firm* — JCIPRNET

(57) ABSTRACT

An off-chip driver (OCD), a pull-up driver of the OCD and the pull-down driver of the OCD are provided. The pull-up driver includes a main current source circuit and a main base circuit. The main current source circuit is connected between a connecting pad and a high reference voltage. The main current source circuit provides a main current value in response to a main control signal. The matching resistance value is associated with the main current value. The main base circuit is connected to the main current source circuit in parallel, and determines a base value of the matching resistance value.

7 Claims, 22 Drawing Sheets

OFF-CHIP DRIVER AND DRIVING CIRCUIT FOR PROVIDING MATCHING RESISTANCE VALUE

BACKGROUND

Technical Field

The disclosure generally relates to an off-chip driver and a driving circuit, and more particularly to an off-chip driver and a driving circuit for providing a matching resistance value.

Description of Related Art

Generally, a semiconductor device (such as memory device or driver) need a setting resistance value to decides at least one of operation parameter of the semiconductor device. The setting resistance value is set by an external matching resistance value provided by an off-chip driver (OCD).

FIG. 1 illustrates an off-chip driver (OCD) and a semiconductor device. Please refer to FIG. 1, the OCD 10 is connected to the semiconductor device SD through a connecting pad PDIO. The OCD 10 includes pull-up drivers 11_1 to 11_3 and pull-down drivers 12_1 to 12_3. The pull-up driver 11_1 is turned on to provide a first pull-up resistance value in response to a control signal SUP1. The pull-up driver 11_2 is turned on to provide a second pull-up resistance value in response to a control signal SUP2. The pull-up driver 11_3 is turned on to provide a third pull-up resistance value in response to a control signal SUP3. The pull-down driver 12_1 is turned on to provide a first pull-down resistance value in response to a control signal SDN1. The pull-down driver 12_2 is turned on to provide a second pull-down resistance value in response to a control signal SDN2. The pull-down driver 12_3 is turned on to provide a third pull-down resistance value in response to a control signal SDN32. Thus, the OCD 10 provides a matching resistance value MR on the connecting pad PDIO according to at least one of resistance values from the pull-up drivers 11_1 to 11_3 and the pull-down drivers 12_1 to 12_3. The matching resistance value MR is set by external device. Thus, the matching resistance value MR of OCD 10 matches the semiconductor device SD or the external device.

In terms of mass production yield requirements, in order to solve an offset phenomenon in the fab process, the OCD 10 needs to use more pull-up drivers and pull-down drivers in parallel to solve the offset phenomenon in the fab process. Therefore, a capacitance value on the connecting pad PDIO is increased. The increasing capacitance value may slow down the response speed of the semiconductor device SD.

SUMMARY

The disclosure provides an off-chip driver (OCD) and a driving circuit. The OCD and the driving circuit provide a matching resistance value having wide range and provides a low capacitance value.

The disclosure provides a pull-up driver of an off-chip driver (OCD) for providing a matching resistance value. The pull-up driver includes a main current source circuit and a main base circuit. The main current source circuit is connected between a connecting pad and a high reference voltage. The main current source circuit provides a main current value in response to a main control signal. The matching resistance value is associated with the main current value. The main base circuit is connected to the main current source circuit in parallel, and determines a base value of the matching resistance value.

The disclosure provides a pull-down driver of an off-chip driver (OCD) for providing a matching resistance value. The pull-down driver includes a main current source circuit and a main base circuit. The main current source circuit is connected between a connecting pad and a low reference voltage. The main current source circuit provides a main current value in response to a main control signal. The matching resistance value is associated with the main current value. The main base circuit is connected to the main current source circuit in parallel, and determines a base value of the matching resistance value.

The disclosure provides a driving circuit for providing a matching resistance value. The driving circuit includes an off-chip driver (OCD) and a control circuit. The OCD includes a connecting pad and a pull-up driver. The pull-up driver is connected between a connecting pad and a high reference voltage. The pull-up driver provides a main pull-up current value in response to a main pull-up control signal and determine a pull-up base value of the matching resistance value. The matching resistance value is associated with the main pull-up current value. The control circuit is connected to the pull-up driver. The control circuit provides the main pull-up control signal to the pull-up driver in response to a command.

Based on the above, each of the OCD and the driving circuit provides the matching resistance value. Each of the OCD and the driving circuit adjusts the matching resistance value from the base value according to the main current value. Therefore, the OCD and the driving circuit provide the matching resistance value having wide range. A number of parallel connections of pull-up drivers and/or pull-down circuits could be decreased. Thus, the OCD and the driving circuit have a low capacitance value on the connecting pad.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 2:
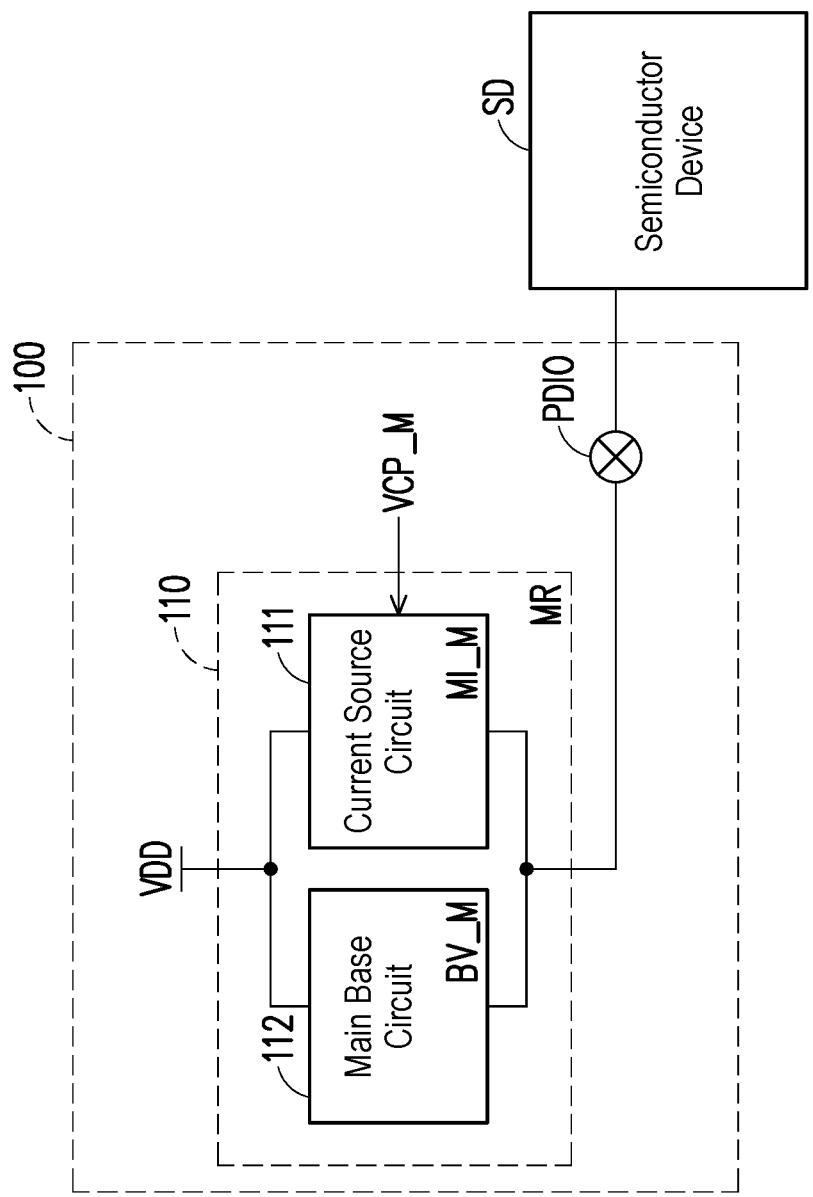
FIG. 2 illustrates a schematic diagram of a pull-up driver of an OCD and a semiconductor device according to an embodiment of the disclosure.

FIG. 2 illustrates a schematic diagram of a pull-up driver of an off-chip driver (OCD) and a semiconductor device according to an embodiment of the disclosure. Please refer to FIG. 2, in the embodiment, the pull-up driver 110 of the OCD 100 provides a matching resistance value MR. The pull-up driver 110 provides a matching resistance value MR on the connecting pad PDIO. The pull-up driver 110 is connected to a semiconductor device SD (such as memory device or driver) through a connecting pad PDIO. The pull-up driver 110 includes a main current source circuit 111 and a main base circuit 112. The main current source circuit 111 is connected between the connecting pad PDIO and a high reference voltage VDD. The main current source circuit 111 provides a main current value MI_M in response to a main control signal VCP_M. The matching resistance value MR is associated with the main current value MI_M. The main base circuit 112 is connected to the main current source circuit 111 in parallel. In other words, the main base circuit 112 is also connected between the connecting pad PDIO and the high reference voltage VDD. The main base circuit 112 determines a base value BV_M of the matching resistance value MR.

In the embodiment, before adjusting the matching resistance value MR, the matching resistance value MR is equal the base value BV_M. When the main current value MI_M is provided, an equivalent resistance value of the main current source circuit 111 is decreased with increasing of the main current value MI_M. Therefore, the matching resistance value MR is decreased from the base value BV_M. The equivalent resistance value of the main current source circuit 111 is increased with decreasing of the main current value MI_M. Therefore, the matching resistance value MR is increased. For example, the base value BV_M is a maximum value of the matching resistance value MR.

It should be noted, the OCD 100 provides the matching resistance value MR and adjusts the matching resistance value MR from the base value BV_M according to the main current value MI_M. Therefore, the OCD 100 provides the matching resistance value MR having wide range. Besides, the OCD provide the matching resistance value MR having wide range. A number of parallel connections of pull-up drivers could be decreased. The number of the pull-up driver 110 is lower than the number of the pull-up drivers 11_1 to 11_3 in FIG. 1. The OCD 100 may use one pull-up driver 110 to provide the matching resistance value MR having wide range. Therefore, the OCD 100 has a low capacitance value on the connecting pad PDIO.

Figure 3:
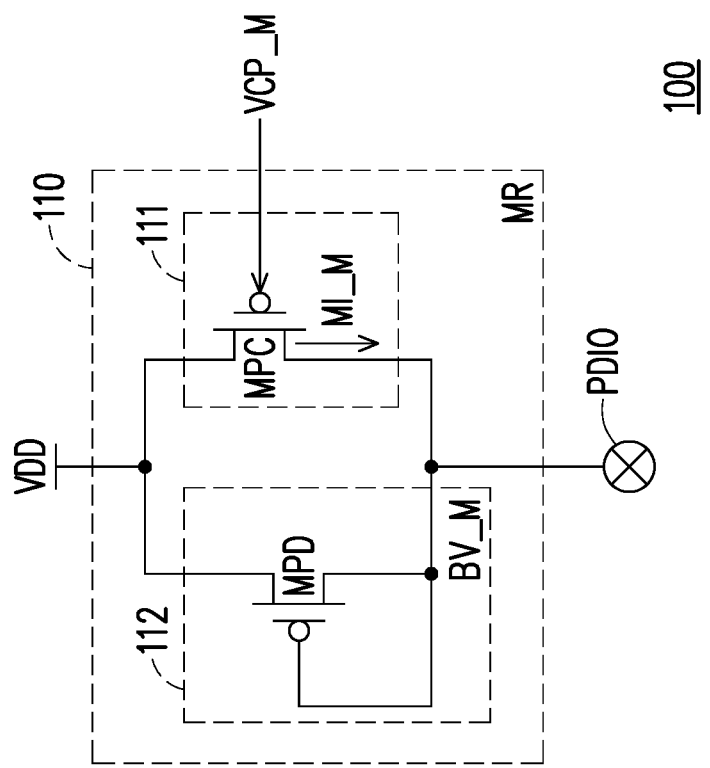
FIG. 3 illustrates a schematic diagram of a pull up-driver of an OCD according to an embodiment of the disclosure.

FIG. 3 illustrates a schematic diagram of a pull-up driver of an OCD according to an embodiment of the disclosure. Please refer to FIG. 3, in the embodiment, the pull-up driver 110 includes the main current source circuit 111 and the main base circuit 112. In the embodiment, the main current source circuit 111 includes a first main transistor MPC. A first terminal of the first main transistor MPC is connected to the high reference voltage VDD. A second terminal of the first main transistor MPC is connected to the connecting pad PDIO. A control terminal of the first main transistor MPC receives the main control signal VCP_M. The first main transistor MPC is operated in a triode region and a saturation region based on the main control signal VCP_M and a voltage value on the connecting pad PDIO. Therefore, the main control signal VCP_M is an analog signal. The first main transistor MPC generates the main current value MI_M in response to a voltage value of the main control signal VCP_M. In the embodiment, the voltage value of the main control signal VCP_M is between the high reference voltage VDD and a low reference voltage.

In the embodiment, the main base circuit 112 includes a second main transistor MPD. A first terminal of the second main transistor MPD is connected to the first terminal of the first main transistor, a second terminal of the second main transistor MPD is connected to a control terminal of the second main transistor MPD and the second terminal of the first main transistor MPC. The second main transistor MPD is connected between the connecting pad PDIO and the high reference voltage VDD in diode-connected manner. When the voltage value on the connecting pad PDIO is lower than a difference value between the high reference voltage VDD and a threshold voltage value (that is, "VDD−Vtp") of the second main transistor MPD, the second main transistor MPD is operated in a saturation region. The second main transistor MPD generates the base value BV_M.

In the embodiment, each of the first main transistor MPC and the second main transistor MPD may be implemented by a P-type field effect transistor (FET), but the disclosure is not limited thereto.

Figure 4:
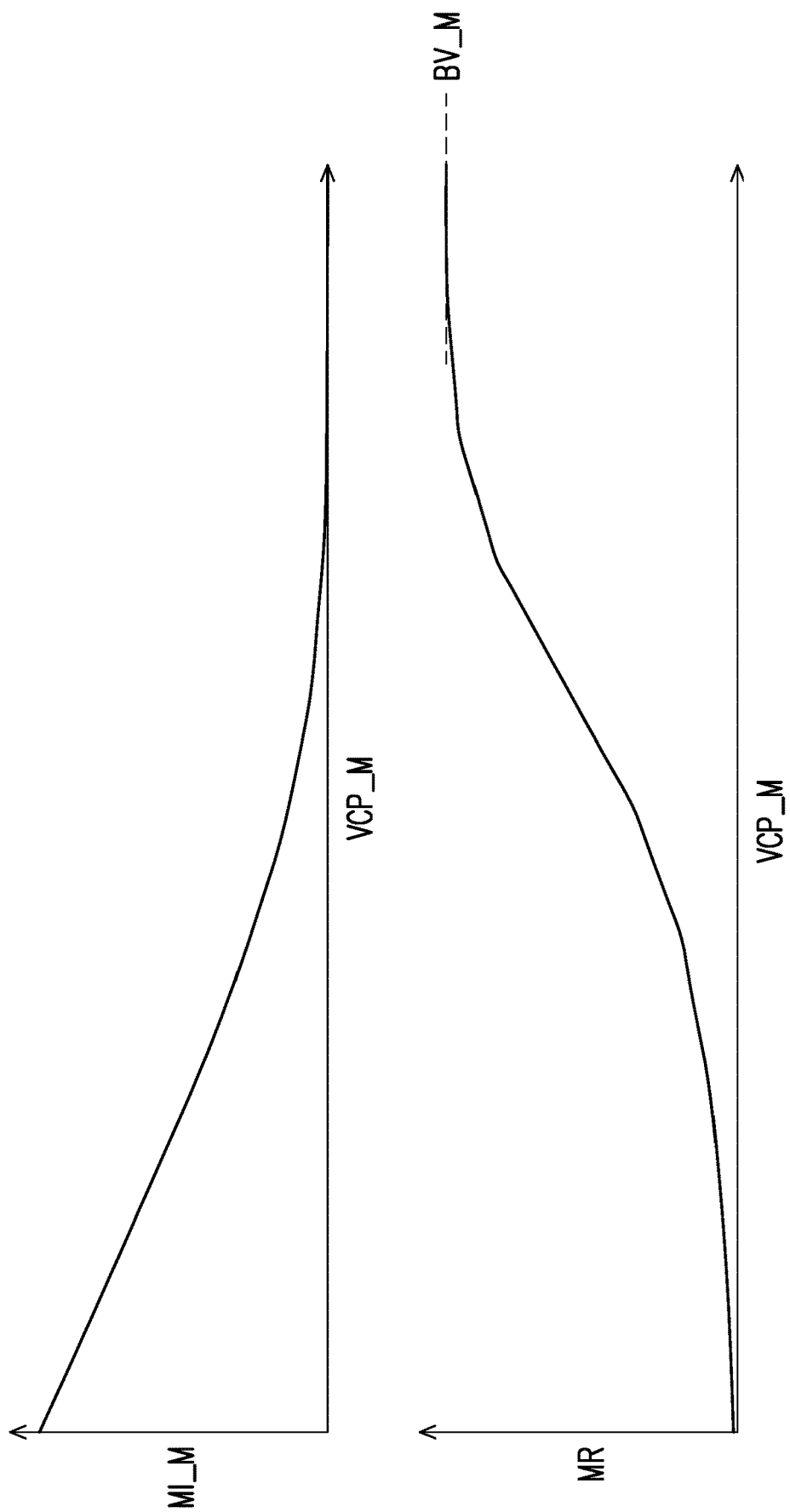
FIG. 4 illustrates a trend diagram of a matching resistance value according to an embodiment of the disclosure.

FIG. 4 illustrates a trend diagram of a matching resistance value according to an embodiment of the disclosure. Please refer to FIG. 3 and FIG. 4, FIG. 4 illustrates a relationship between the main control signal VCP_M, the main current value MI_M and the matching resistance value MR. In the embodiment, the second main transistor MPD generates the base value BV_M. When the first main transistor MPC is turned off according to the main control signal VCP_M, the matching resistance value MR is equal to the base value BV_M. When the voltage value of the main control signal VCP_M is decreased. The main current value MI_M is increased. The equivalent resistance value of the main current source circuit 111 is decreased. Therefore, the matching resistance value MR is decreased from the base value BV_M.

Figure 1:
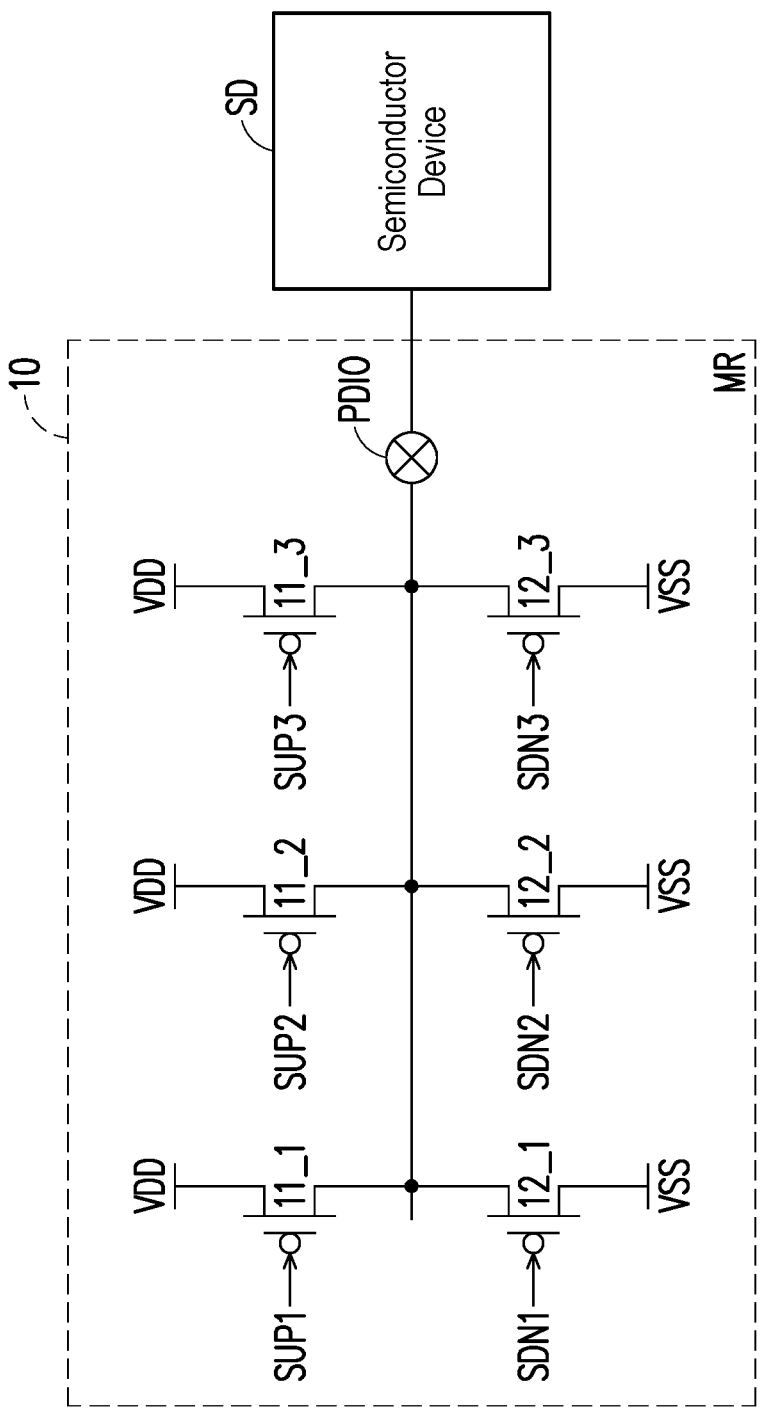
FIG. 1 illustrates an off-chip driver (OCD) and a semiconductor device.

It should be noted, the OCD 100 provides the matching resistance value MR having wide range based on the voltage value of the main control signal VCP_M by one pull-up driver 110. Therefore, an area of the OCD 100 is smaller than an area of the OCD 10 as shown in FIG. 1. Besides, the main base circuit 112 decides the base value BV_M. The second main transistor MPD is designed to decide the base value BV_M based on design requirements. Therefore, the OCD 100 provides the matching resistance value MR in a design range.

Figure 5A:
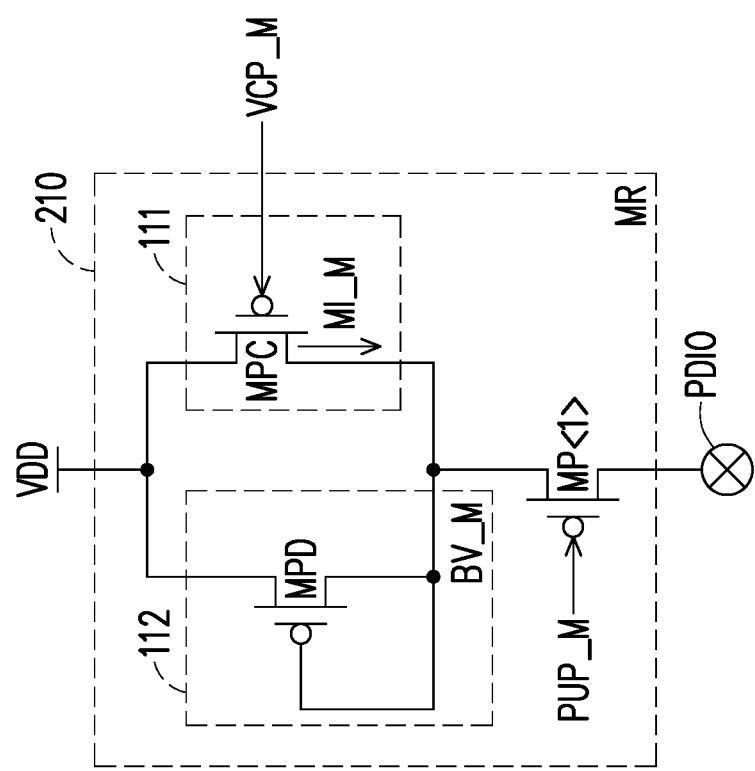
FIG. 5A to FIG. 5D illustrate a schematic diagram of a pull-up driver of an OCD according to an embodiment of the disclosure.

FIG. 5A illustrates a schematic diagram of a pull-up driver of an OCD according to an embodiment of the disclosure. Please refer to FIG. 5A, in the embodiment, the pull-up driver 210 includes the main current source circuit 111, the main base circuit 112 and a main pull-up switch MP<1>. In the embodiment, the main current source circuit 111 includes the first main transistor MPC. The main base circuit 112 includes the second main transistor MPD. The configuration of the main current source circuit 111 and the main base circuit 112 has been clearly explained in the embodiments of FIG. 2 and FIG. 3, so it will not be repeated here.

In the embodiment, the main pull-up switch MP<1> is connected to the main current source circuit 111, the main base circuit 112 and the connecting pad PDIO. The main pull-up switch MP<1> connects the main current source circuit 111 and the main base circuit 112 to the connecting pad PDIO in response to a main switching signal PUP_M. For example, the main pull-up switch MP<1> may be implemented by a P-type FET, but the disclosure is not limited thereto. The main pull-up switch MP<1> is turned off in response to a high voltage level of the main switching signal PUP_M. When the main pull-up switch MP<1> is turned off, the pull-up driver 210 does not provide the matching resistance value MR to the connecting pad PDIO. The main pull-up switch MP<1> is turned on in response to a low voltage level of the main switching signal PUP_M. When the main pull-up switch MP<1> is turned on, the pull-up driver 210 provides the matching resistance value MR to the connecting pad PDIO. In the embodiment, the main switching signal PUP_M is a digital signal.

Figure 5B:
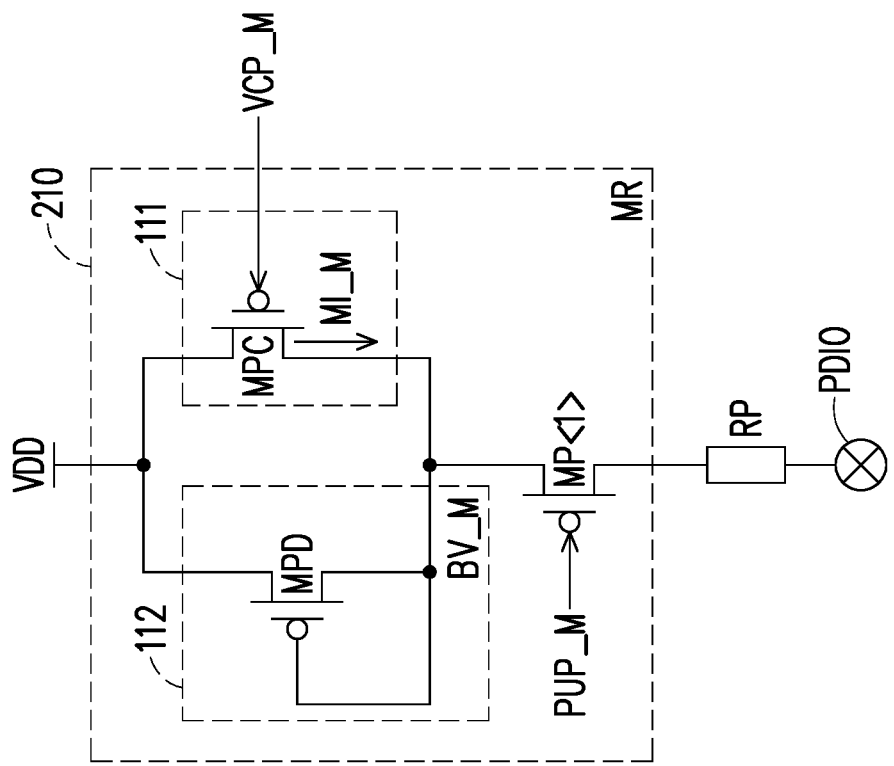

FIG. 5B illustrates a schematic diagram of a pull-up driver of an OCD according to an embodiment of the disclosure. Please refer to FIG. 5B, in the embodiment, the pull-up driver 210 includes the main current source circuit 111, the main base circuit 112 and the main pull-up switch MP<1>. In the embodiment, the main current source circuit 111 includes the first main transistor MPC. The main base circuit 112 includes the second main transistor MPD. The configuration of the main current source circuit 111, the main base circuit 112 and the main pull-up switch MP<1> has been clearly explained in the embodiments of FIG. 2, FIG. 3 and FIG. 5A, so it will not be repeated here.

In the embodiment, the resistor RP is connected between the connecting pad PDIO and the pull-up driver 210. The resistor RP is used to suppress an electrostatic discharge in the pull-up driver 210. Besides, when the main pull-up switch MP<1> is turned on, the pull-up driver 210 and the resistor RP commonly provide the matching resistance value MR.

Figure 5C:
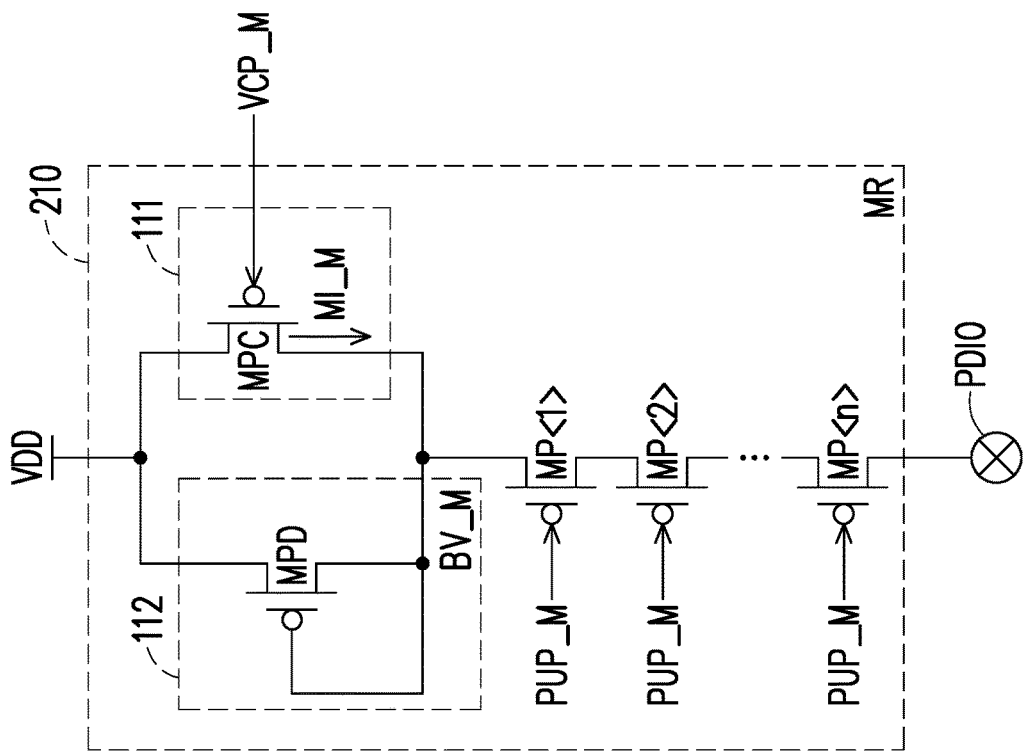

FIG. 5C illustrates a schematic diagram of a pull-up driver of an OCD according to an embodiment of the disclosure. Please refer to FIG. 5C, in the embodiment, the pull-up driver 210 includes the main current source circuit 111, the main base circuit 112 and main pull-up switches MP<1> to MP<n>. "n" is a positive integer greater than "2". In the embodiment, the main current source circuit 111 includes the first main transistor MPC. The main base circuit 112 includes the second main transistor MPD. The configuration of the main current source circuit 111 and the main base circuit 112 has been clearly explained in the embodiments of FIG. 2 and FIG. 3, so it will not be repeated here.

In the embodiment, the main pull-up switches MP<1> to MP<n> is connected in series. For example, each of the main pull-up switch MP<1> may be implemented by a P-type FET, but the disclosure is not limited thereto. The main pull-up switches MP<1> to MP<n> are turned off in response to a high voltage level of the main switching signal PUP_M. When the main pull-up switches MP<1> to MP<n> are turned off, the pull-up driver 210 does not provide the matching resistance value MR to the connecting pad PDIO. The main pull-up switches MP<1> to MP<n> are turned on in response to a low voltage level of the main switching signal PUP_M. When the main pull-up switches MP<1> to MP<n> are turned on, the pull-up driver 210 provides the matching resistance value MR to the connecting pad PDIO. The disclosure is not limited by a number of series connections of the main pull-up switches.

Figure 5D:
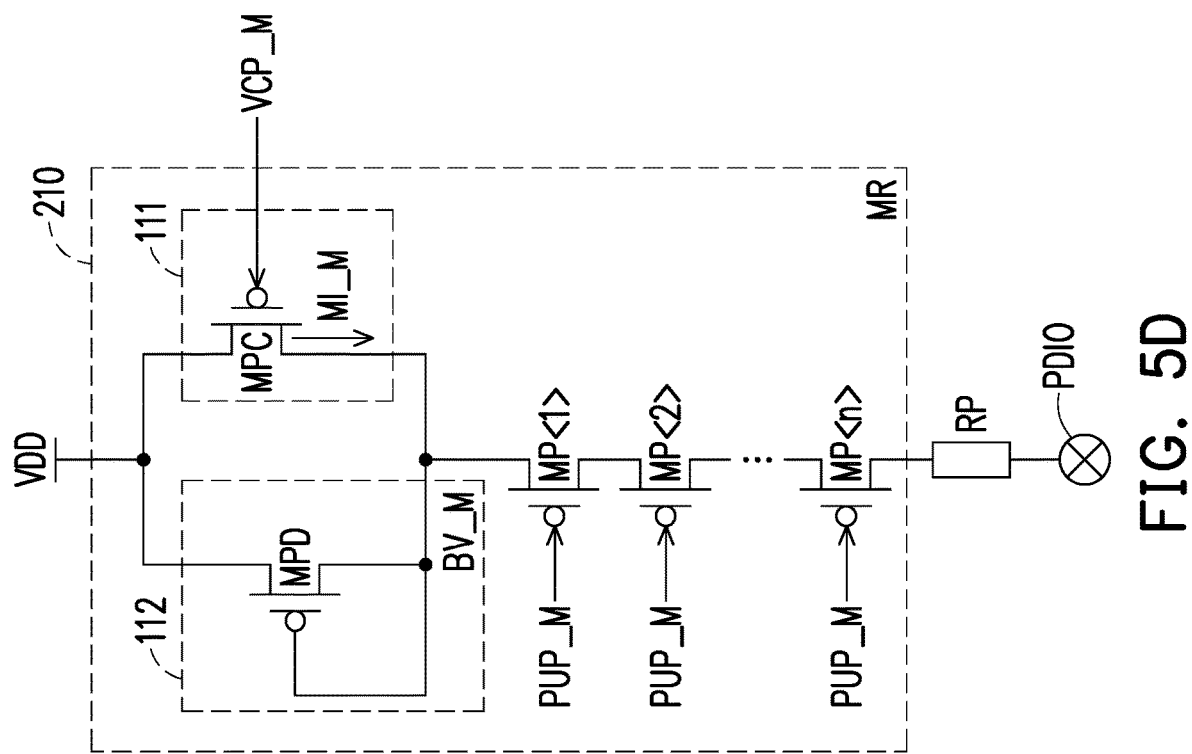

FIG. 5D illustrates a schematic diagram of a pull-up driver of an OCD according to an embodiment of the disclosure. Please refer to FIG. 5D, in the embodiment, the pull-up driver 210 includes the main current source circuit 111, the main base circuit 112 and the main pull-up switches MP<1> to MP<n>. In the embodiment, the main current source circuit 111 includes the first main transistor MPC. The main base circuit 112 includes the second main transistor MPD. The configuration of the main current source circuit 111, the main base circuit 112 and the main pull-up switches MP<1> to MP<n> has been clearly explained in the embodiments of FIG. 2, FIG. 3 and FIG. 5C, so it will not be repeated here.

In the embodiment, the resistor RP is connected between the connecting pad PDIO and the pull-up driver 210. The resistor RP is used to suppress the electrostatic discharge in the pull-up driver 210. Besides, when the main pull-up switch MP<1> to MP<n> is turned on, the pull-up driver 210 and the resistor RP commonly provide the matching resistance value MR.

Figure 6:
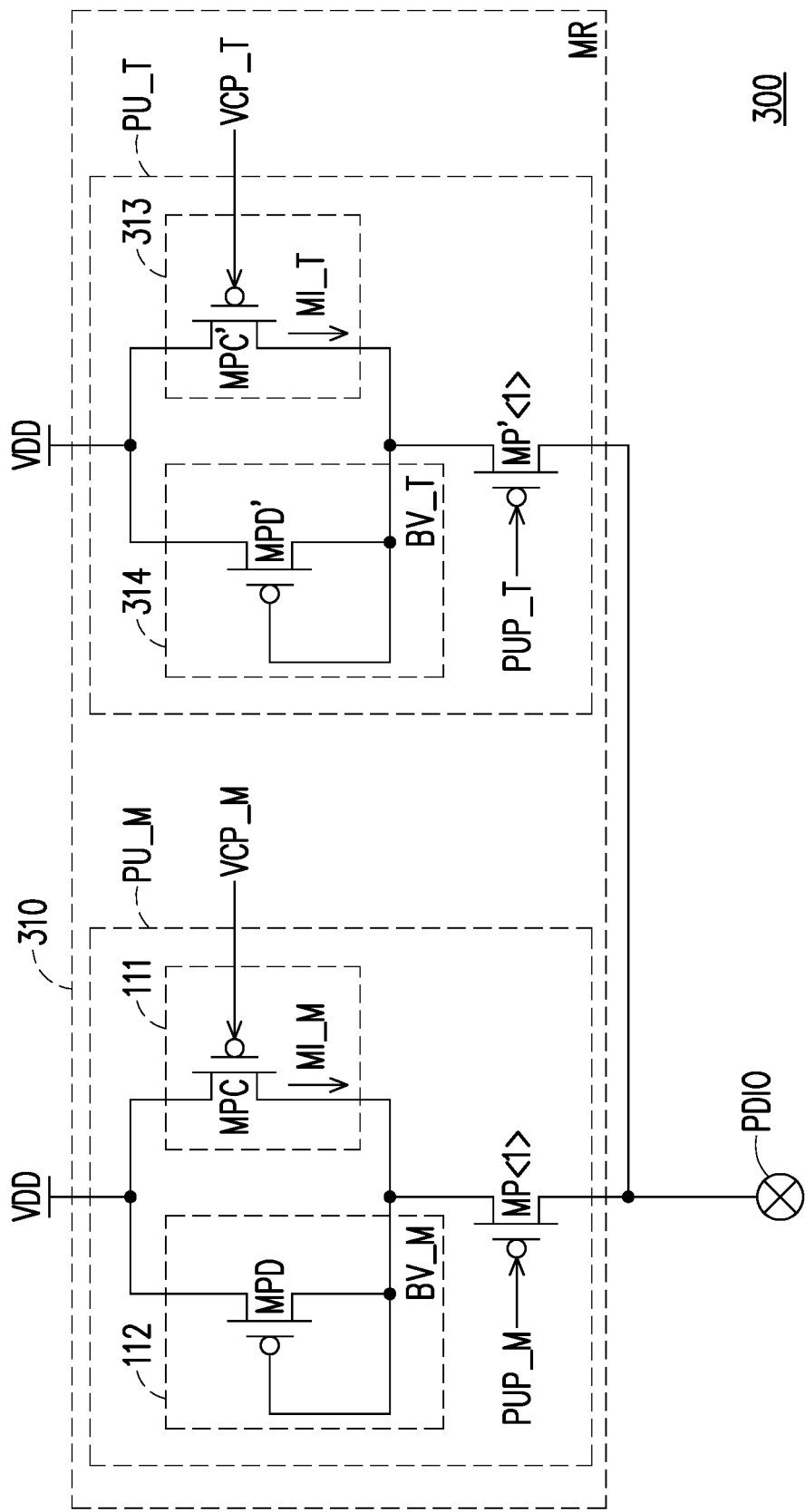
FIG. 6 illustrates a schematic diagram of a pull up-driver of an OCD according to an embodiment of the disclosure.

FIG. 6 illustrates a schematic diagram of a pull-up driver of an OCD according to an embodiment of the disclosure. Please refer to FIG. 6, in the embodiment, the pull-up driver 310 includes the main current source circuit 111, the main base circuit 112, the main pull-up switch MP<1>, an auxiliary current source circuit 313, an auxiliary base circuit 314 and an auxiliary pull-up switch MP'<1>. The configuration of the main current source circuit 111, the main base circuit 112 and the main pull-up switch MP<1> has been clearly explained in the embodiments of FIG. 2, FIG. 3 and FIG. 5A, so it will not be repeated here. The auxiliary current source circuit 313 is connected between the connecting pad PDIO and the high reference voltage VDD. The auxiliary current source circuit 313 provides an auxiliary current value MI_T in response to an auxiliary control signal VCP_T. The matching resistance value MR is trimmed by the auxiliary current value MI_T.

In the embodiment, the auxiliary current source circuit 313 includes a first auxiliary transistor MPC'. A first terminal of the first auxiliary transistor MPC' is connected to the high reference voltage VDD. A second terminal of the first auxiliary transistor MPC' is connected to the connecting pad PDIO through the auxiliary pull-up switch MP'<1>. A control terminal of the first auxiliary transistor MPC' receives the auxiliary control signal VCP_T. The first auxiliary transistor MPC' is operated in the triode region and the saturation region based on the auxiliary control signal VCP_T and the voltage value on the connecting pad PDIO. An external system voltage is decided in a voltage range (for example, 0.5×VDD to 0.8×VDD). Therefore, based on the external system voltage, the auxiliary control signal VCP_T is adjusted according to a required current of the first auxiliary transistor MPC'. Therefore, the main control signal VCP_T is an analog signal. The first auxiliary transistor MPC' generates the main current value MI_T in response to a voltage value of the auxiliary control signal VCP_T. In the embodiment, the voltage value of the auxiliary control signal VCP_T is between the high reference voltage VDD and a low reference voltage.

The auxiliary base circuit 314 includes a second auxiliary transistor MPD'. A first terminal of the second auxiliary transistor MPD' is connected to the first terminal of the first auxiliary transistor MPC'. A second terminal of the second auxiliary transistor MPD' is connected to a control terminal of the second auxiliary transistor MPD' and the second terminal of the first auxiliary transistor MPC'. The second auxiliary transistor MPD' is connected between the connecting pad PDIO and the high reference voltage VDD in diode-connected manner. Therefore, the second auxiliary transistor MPD' is operated in a saturation region. The second auxiliary transistor MPD' generates the base value BV_T. The base value BV_T is decided by the voltage value on the connecting pad PDIO, a voltage value crossing the auxiliary pull-up switch MP'<1> and a size of the second auxiliary transistor MPD'. In the embodiment, each of the first auxiliary transistor MPC' and the second auxiliary transistor MPD' may be implemented by a P-type FET, but the disclosure is not limited thereto.

The auxiliary base circuit 314 is connected to the auxiliary current source circuit 313 in parallel. The auxiliary base circuit 314 determines an auxiliary base value BV_T of the matching resistance value. The matching resistance value MR is also trimmed by the auxiliary base value BV_T.

In some embodiments, the auxiliary base circuit 314 may be omitted.

In the embodiment, the auxiliary pull-up switch MP'<1> is connected to the auxiliary current source circuit 313, the auxiliary base circuit 314 and the connecting pad PDIO. When the auxiliary pull-up switch MP'<1> is turned on in response to a low voltage level of an auxiliary switching signal PUP_T, the auxiliary current source circuit 313 and the auxiliary base circuit 314 are connected to the connecting pad PDIO. Therefore, the matching resistance value MR is trimmed by the auxiliary base value BV_T and the auxiliary current value MI_T. When the auxiliary pull-up switch MP'<1> is turned off in response to a high voltage level of the auxiliary switching signal PUP_T, the auxiliary current source circuit 313 and the auxiliary base circuit 314 are not connected to the connecting pad PDIO. Therefore, the matching resistance value MR is not trimmed by the auxiliary base value BV_T and the auxiliary current value MI_T. In the embodiment, the auxiliary switching signal PUP_T is a digital signal.

Figure 7A:
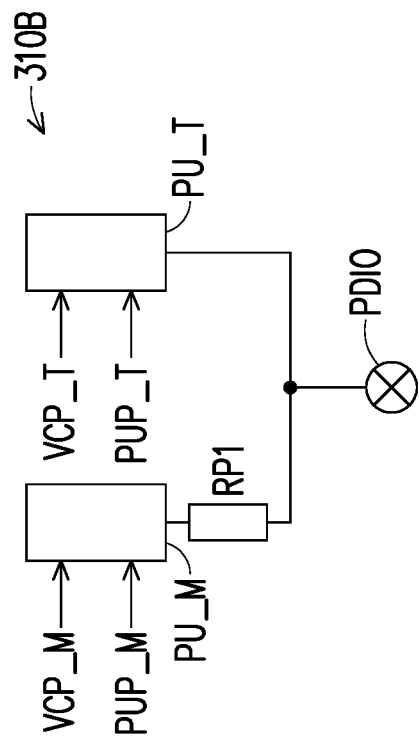
FIG. 7A to FIG. 7H illustrate a schematic diagram of a pull-up driver of an OCD according to an embodiment of the disclosure.

FIG. 7A illustrates a schematic diagram of a pull-up driver of an OCD according to an embodiment of the disclosure. Please refer to FIG. 6 and FIG. 7A, in the embodiment, in the pull-up driver 310A, the main current source circuit 111, the main base circuit 112 and the main pull-up switch MP<1> may be act as a main pull-up circuit PU_M. The auxiliary current source circuit 313, the auxiliary base circuit 314 and the auxiliary pull-up switch MP'<1> may be act as an auxiliary pull-up circuit PU_T.

Figure 7C:
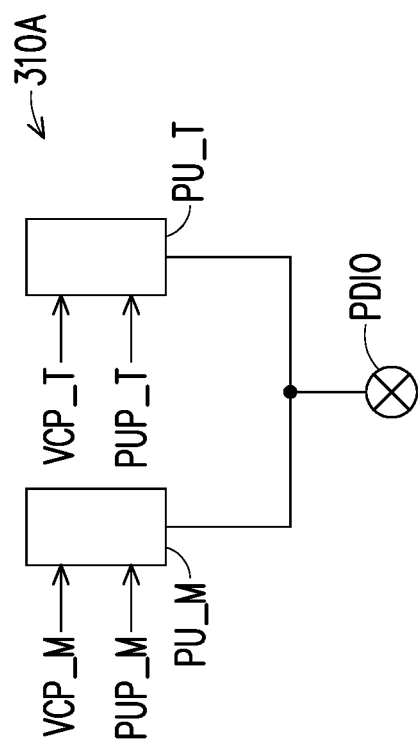
Figure 7B:
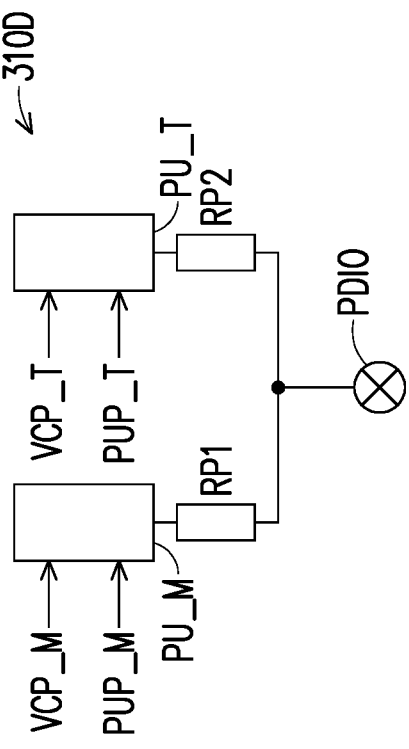

FIG. 7B illustrates a schematic diagram of a pull-up driver of an OCD according to an embodiment of the disclosure. In the embodiment, comparing to FIG. 7A, the pull-up driver 310B as shown in FIG. 7B further includes a resistor RP1. The resistor RP1 is connected between the connecting pad PDIO and the main pull-up circuit PU_M. The resistor RP1 is used to suppress an electrostatic discharge in the main pull-up circuit PU_M.

FIG. 7C illustrates a schematic diagram of a pull-up driver of an OCD according to an embodiment of the disclosure. In the embodiment, comparing to FIG. 7A, the pull-up driver 310C as shown in FIG. 7C further includes a resistor RP2. The resistor RP2 is connected between the connecting pad PDIO and the auxiliary pull-up circuit PU_T. The resistor RP2 is used to suppress an electrostatic discharge in the auxiliary pull-up circuit PU_T.

Figure 7D:
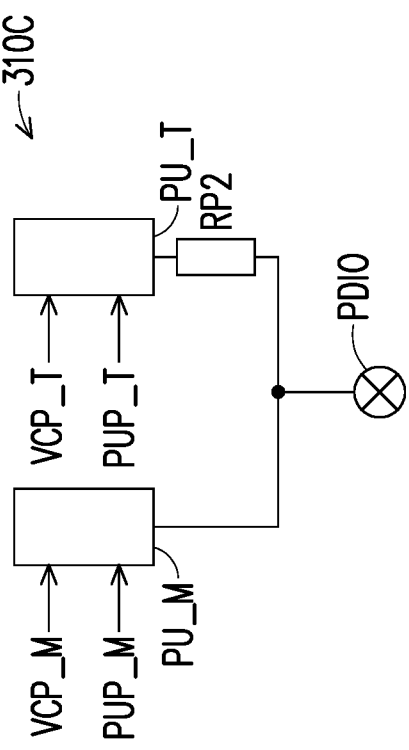

FIG. 7D illustrates a schematic diagram of a pull-up driver of an OCD according to an embodiment of the disclosure. In the embodiment, comparing to FIG. 7A, the pull-up driver 310D as shown in FIG. 7D further includes the resistors RP1, RP2. The resistor RP1 is connected between the connecting pad PDIO and the main pull-up circuit PU_M. The resistor RP1 is used to suppress an electrostatic discharge in the main pull-up circuit PU_M. The resistor RP2 is connected between the connecting pad PDIO and the auxiliary pull-up circuit PU_T. The resistor RP2 is used to suppress an electrostatic discharge in the auxiliary pull-up circuit PU_T.

Figure 7E:
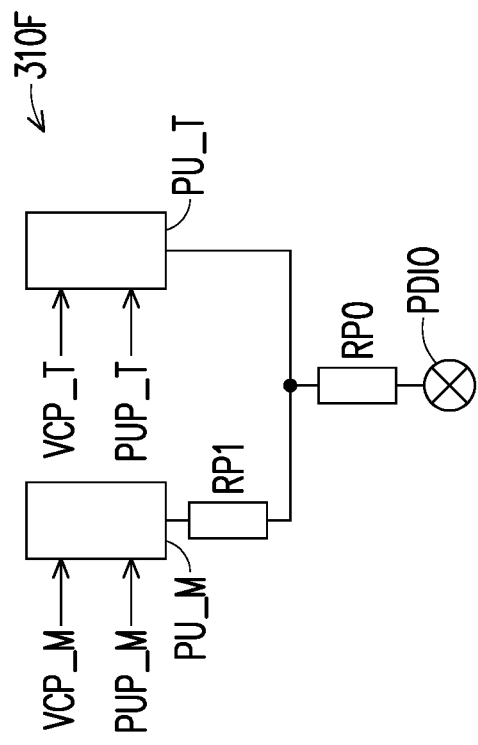

FIG. 7E illustrates a schematic diagram of a pull-up driver of an OCD according to an embodiment of the disclosure. In the embodiment, comparing to FIG. 7A, the pull-up driver 310E as shown in FIG. 7E further includes a resistor RP0. A first terminal of the resistor RP0 is connected to the auxiliary pull-up circuit PU_T and the main pull-up circuit PU_M. A second terminal of the resistor RP0 is connected to the connecting pad PDIO. The resistor RP0 is used to suppress an electrostatic discharge in the auxiliary pull-up circuit PU_T and the main pull-up circuit PU_M.

Figure 7F:
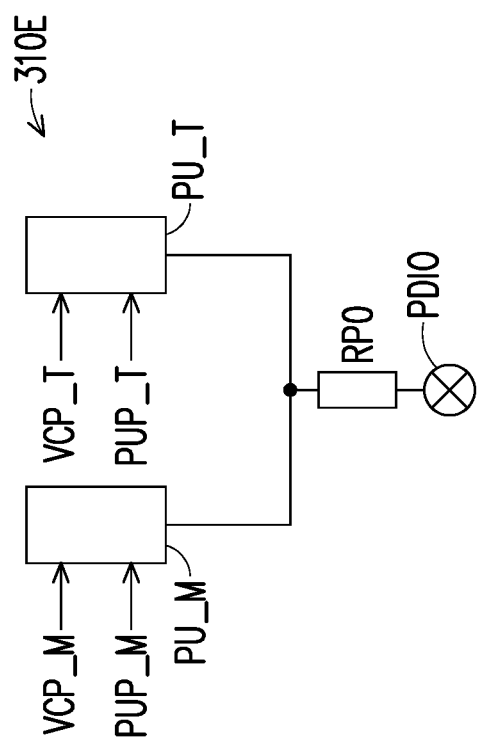

FIG. 7F illustrates a schematic diagram of a pull-up driver of an OCD according to an embodiment of the disclosure. In the embodiment, comparing to FIG. 7B, the pull-up driver 310F as shown in FIG. 7F further includes the resistor RP0.

Figure 7G:
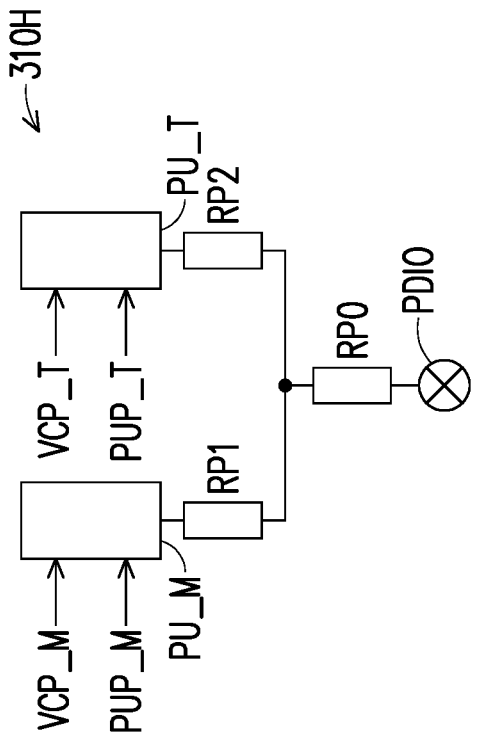

FIG. 7G illustrates a schematic diagram of a pull-up driver of an OCD according to an embodiment of the disclosure. In the embodiment, comparing to FIG. 7C, the pull-up driver 310G as shown in FIG. 7G further includes the resistor RP0.

Figure 7H:
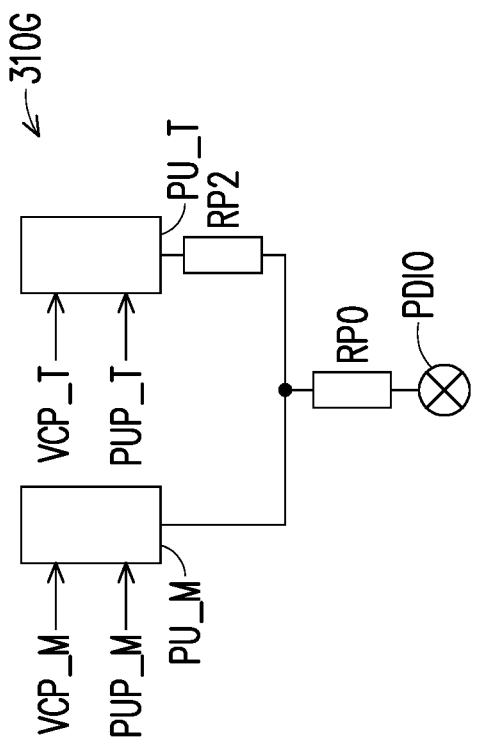

FIG. 7H illustrates a schematic diagram of a pull-up driver of an OCD according to an embodiment of the disclosure. In the embodiment, comparing to FIG. 7D, the pull-up driver 310H as shown in FIG. 7H further includes the resistor RP0.

Figure 8:
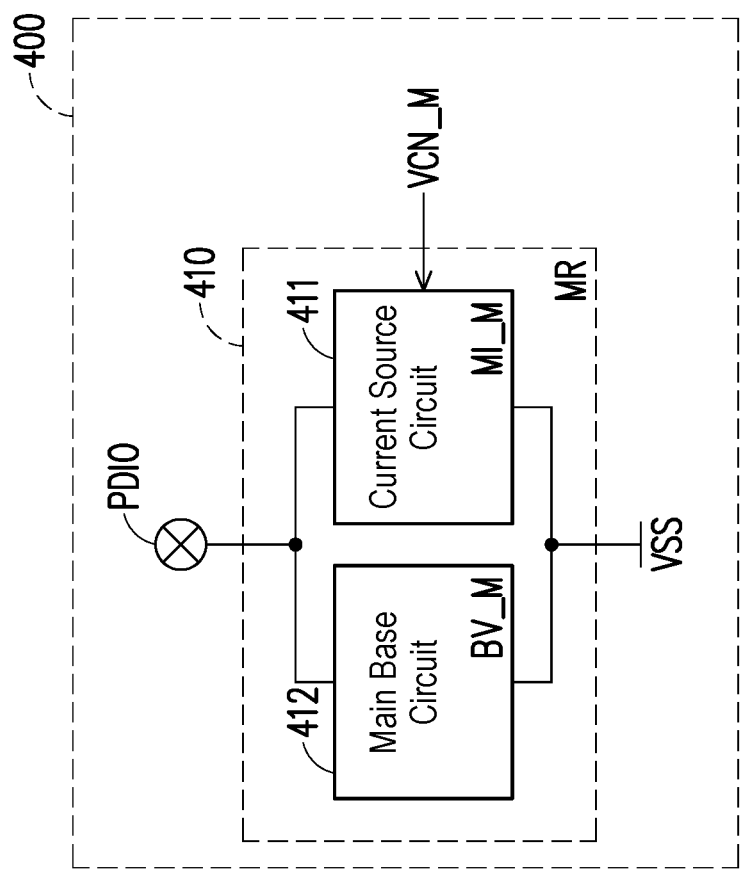
FIG. 8 illustrates a schematic diagram of a pull-down driver of an OCD according to an embodiment of the disclosure.

FIG. 8 illustrates a schematic diagram of a pull-down driver of an OCD according to an embodiment of the disclosure. Please refer to FIG. 8, in the embodiment, the pull-down driver 410 of the OCD 400 provides a matching resistance value MR. The pull-down circuit 410 includes a main current source circuit 411 and a main base circuit 412. The main current source circuit 411 is connected between the connecting pad PDIO and a low reference voltage VSS. The main current source circuit 411 provides a main current value MI_M in response to a main control signal VCN_M. The matching resistance value MR is associated with the main current value MI_M. The main base circuit 412 is connected to the main current source circuit 411 in parallel. In other words, the main base circuit 412 is also connected between the connecting pad PDIO and the low reference voltage VSS. The main base circuit 412 determines a base value BV_M of the matching resistance value MR.

In the embodiment, before adjusting the matching resistance value MR, the matching resistance value MR is equal the base value BV_M. When the main current value MI_M is provided, an equivalent resistance value of the main current source circuit 411 is decreased with increasing of the main current value MI_M. Therefore, the matching resistance value MR is decreased from the base value BV_M. The equivalent resistance value of the main current source circuit 411 is increased with decreasing of the main current value MI_M. Therefore, the matching resistance value MR is increased. For example, the base value BV_M is a maximum value of the matching resistance value MR.

The pull-down driver 410 provides the matching resistance value MR and adjusts the matching resistance value MR from the base value BV_M according to the main current value MI_M. Therefore, the pull-down driver 410 provides the matching resistance value MR having wide range. Besides, the OCD provide the matching resistance value MR having wide range. A number of parallel connections of pull-down circuits could be decreased. The pull-down driver 410 may use one pull-down circuit 410 to provide the matching resistance value MR having wide range. Therefore, the OCD 400 has a low capacitance value on the connecting pad PDIO.

Figure 9:
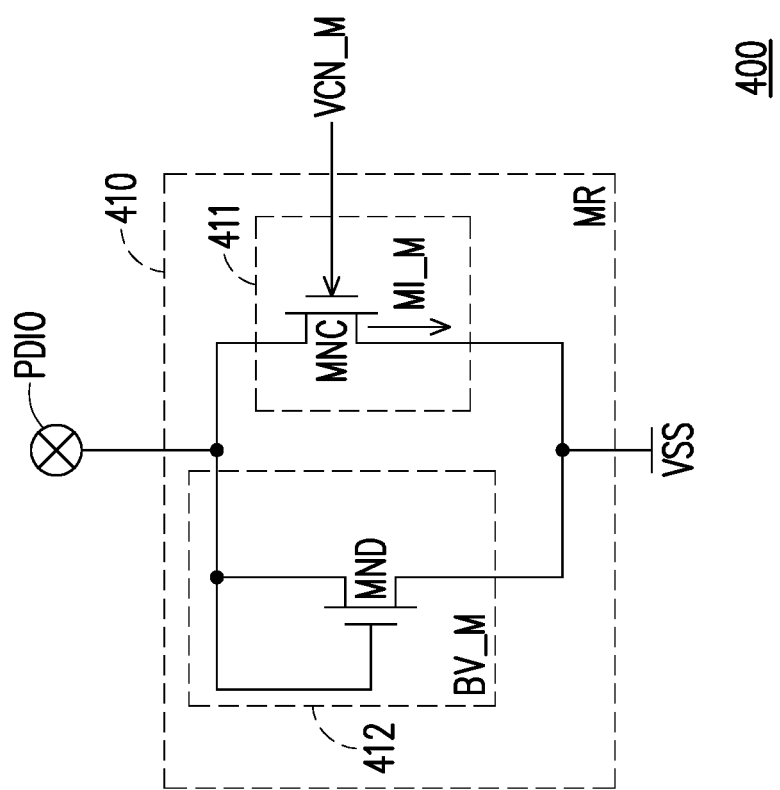
FIG. 9 illustrates a schematic diagram of a pull-down driver of an OCD according to an embodiment of the disclosure.

FIG. 9 illustrates a schematic diagram of a pull-down driver of an OCD according to an embodiment of the disclosure. Please refer to FIG. 9, in the embodiment, the pull-down circuit 410 includes the main current source circuit 411 and the main base circuit 412. In the embodiment, the main current source circuit 411 includes a first main transistor MNC. A first terminal of the first main transistor MNC is connected to the connecting pad PDIO. A second terminal of the first main transistor MNC is connected to the low reference voltage VSS. A control terminal of the first main transistor receives the main control signal VCN_M. The first main transistor MNC is operated in the triode region and the saturation region based on the main control signal VCN_M and the voltage value on the connecting pad PDIO. The external system voltage is decided in a voltage range (for example, 0.5×VDD to 0.8×VDD). Therefore, based on the external system voltage, the main control signal VCN_M is adjusted according to a required current of the first main transistor MNC. Therefore, the main control signal VCN_M is an analog signal. The first main transistor MNC generates the main current value MI_M in response to a voltage value of the main control signal VCN_M. In the embodiment, the voltage value of the main control signal VCN_M is between the high reference voltage VDD and the low reference voltage VSS.

In the embodiment, the main base circuit 412 includes a second main transistor MND. A first terminal of the second main transistor MND is connected to a control terminal of the second main transistor MND and the first terminal of the first main transistor MNC. A second terminal of the second main transistor MND is connected to the second terminal of the first main transistor MNC. The second main transistor MND is connected between the connecting pad PDIO and a low reference voltage VSS in diode-connected manner. When the voltage value on the connecting pad PDIO is higher than a threshold voltage value of the second main transistor MND, the second main transistor MND is operated in a saturation region. The second main transistor MND generates the base value BV_M.

In the embodiment, each of the first main transistor MNC and the second main transistor MND may be implemented by a N-type field effect transistor (FET), but the disclosure is not limited thereto.

Figure 10:
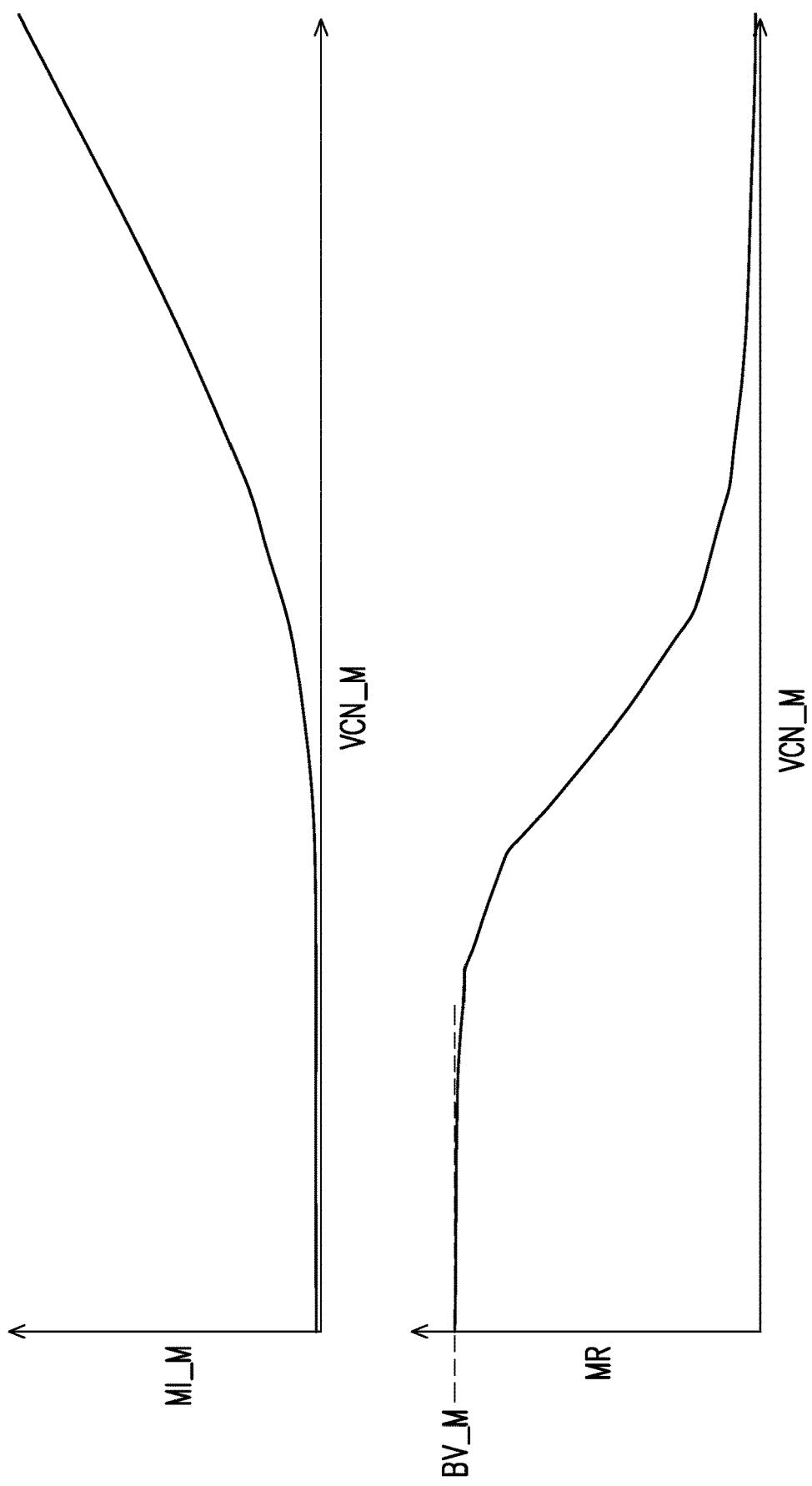
FIG. 10 illustrates a trend diagram of a matching resistance value according to an embodiment of the disclosure.

FIG. 10 illustrates a trend diagram of a matching resistance value according to an embodiment of the disclosure. Please refer to FIG. 9 and FIG. 10, FIG. 10 illustrates a relationship between the main control signal VCN_M, the main current value MI_M and the matching resistance value MR. In the embodiment, the second main transistor MND generates the base value BV_M. When the first main transistor MNC is turned off according to the main control signal VCN_M, the matching resistance value MR is equal to the base value BV_M. When the voltage value of the main control signal VCN_M is increased. The main current value MI_M is increased. The equivalent resistance value of the main current source circuit 411 is decreased. Therefore, the matching resistance value MR is decreased from the base value BV_M.

Figure 11A:
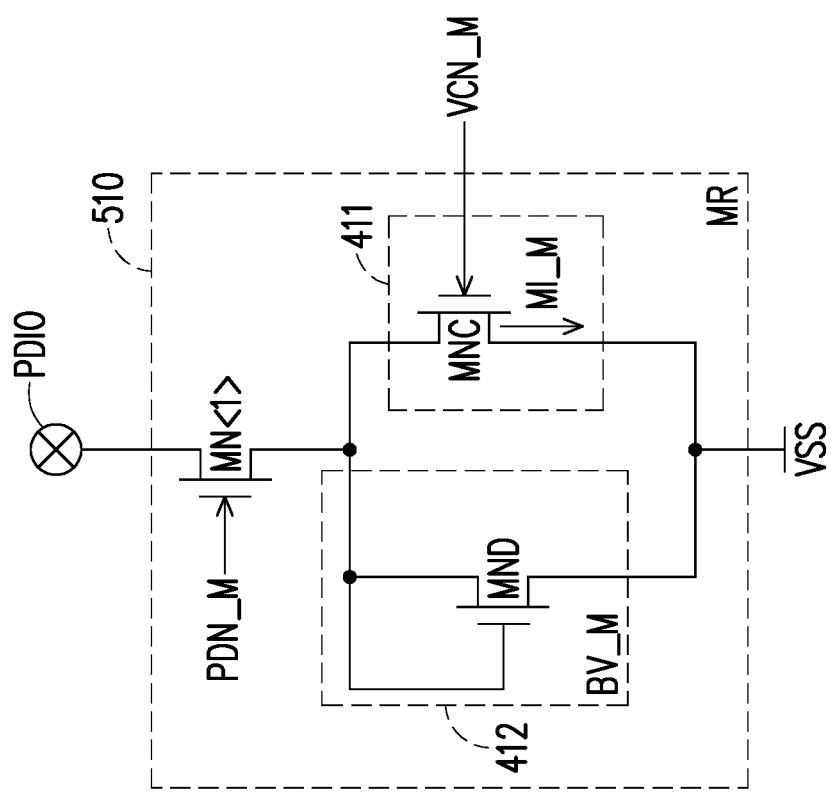
FIG. 11A to FIG. 11D illustrate a schematic diagram of a pull-down driver of an OCD according to an embodiment of the disclosure.

FIG. 11A illustrates a schematic diagram of a pull-down driver of an OCD according to an embodiment of the disclosure. Please refer to FIG. 11A, in the embodiment, the pull-down circuit 510 includes the main current source circuit 411, the main base circuit 412 and a main pull-down switch MN<1>. In the embodiment, the main current source circuit 411 includes the first main transistor MNC. The main base circuit 412 includes the second main transistor MND. The configuration of the main current source circuit 411 and the main base circuit 412 has been clearly explained in the embodiments of FIG. 8 and FIG. 9, so it will not be repeated here.

In the embodiment, the main pull-down switch MN<1> is connected to the main current source circuit 411, the main base circuit 412 and the connecting pad PDIO. The main pull-down switch MN<1> connects the main current source circuit 411 and main base circuit 412 to the connecting pad PDIO in response to a main switching signal PDN_M. For example, the main pull-down switch MN<1> may be implemented by a N-type FET, but the disclosure is not limited thereto. The main pull-down switch MN<1> is turned off in response to a low voltage level of the main switching signal PDN_M. When the main pull-down switch MN<1> is turned off, the pull-down circuit 510 does not provide the matching resistance value MR to the connecting pad PDIO. The main pull-down switch MN<1> is turned on in response to a high voltage level of the main switching signal PDN_M.

When the main pull-down switch MN<1> is turned on, the pull-down circuit 510 provides the matching resistance value MR to the connecting pad PDIO. In the embodiment, the main switching signal PDN_M is a digital signal.

Figure 11B:
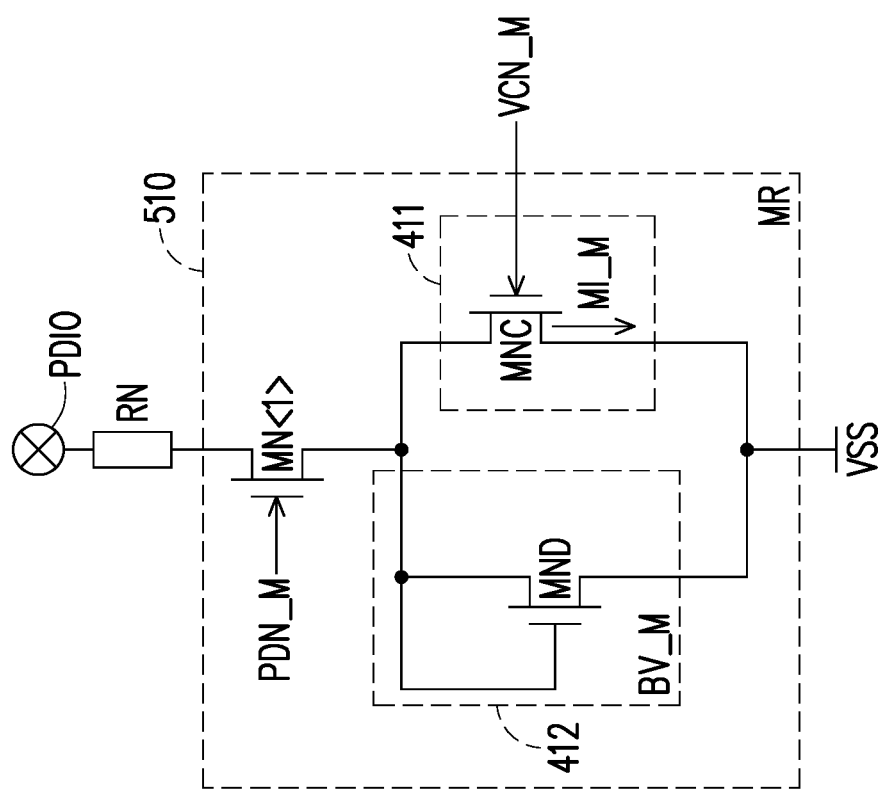

FIG. 11B illustrates a schematic diagram of a pull-down driver of an OCD according to an embodiment of the disclosure. Please refer to FIG. 11B, in the embodiment, the pull-down circuit 510 includes the main current source circuit 411, the main base circuit 412 and the main pull-down switch MN<1>. In the embodiment, the main current source circuit 411 includes the first main transistor MNC. The main base circuit 412 includes the second main transistor MND. The configuration of the main current source circuit 411, the main base circuit 412 and the main pull-down switch MN<1> has been clearly explained in the embodiments of FIG. 8, FIG. 9 and FIG. 11A, so it will not be repeated here.

In the embodiment, the resistor RN is connected between the connecting pad PDIO and the pull-down circuit 510. The resistor RN is used to suppress an electrostatic discharge in the pull-down circuit 510. Besides, when the main pull-down switch MN<1> is turned on, the pull-down driver 410 and the resistor RN commonly provide the matching resistance value MR.

Figure 11C:
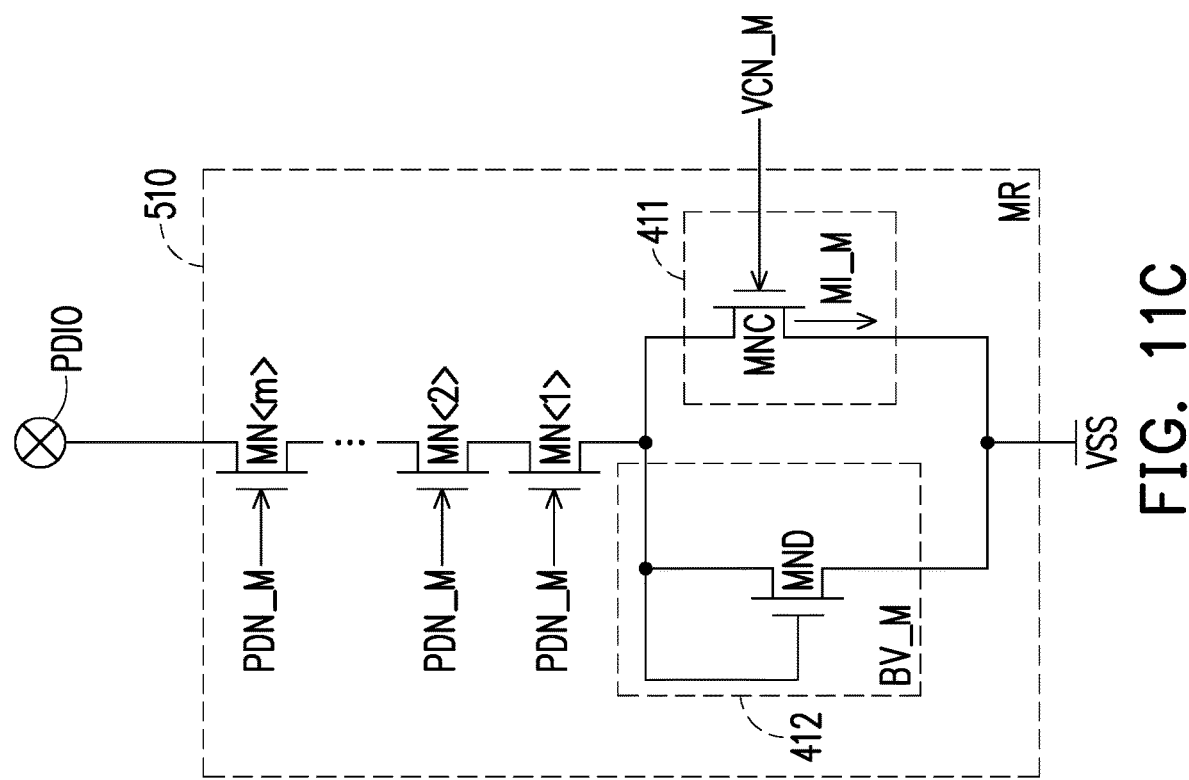

FIG. 11C illustrates a schematic diagram of a pull-down driver of an OCD according to an embodiment of the disclosure. Please refer to FIG. 11C, in the embodiment, the pull-down circuit 510 includes the main current source circuit 411, the main base circuit 412 and main pull-down switches MN<1> to MN<m>. "m" is a positive integer greater than "2". In the embodiment, the main current source circuit 411 includes the first main transistor MNC. The main base circuit 412 includes the second main transistor MND. The configuration of the main current source circuit 411 and the main base circuit 412 has been clearly explained in the embodiments of FIG. 8 and FIG. 9, so it will not be repeated here. The disclosure is not limited by a number of series connections of the main pull-down switches.

In the embodiment, the main pull-down switches MN<1> to MN<m> is connected in series. For example, each of the main pull-down switches MN<1> to MN<m> may be implemented by a N-type FET, but the disclosure is not limited thereto. The main pull-down switches MN<1> to MN<m> are turned off in response to a low voltage level of the main switching signal PDN_M. When the main pull-down switches MN<1> to MN<m> are turned off, the pull-down circuit 510 does not provide the matching resistance value MR to the connecting pad PDIO. The main pull-down switches MN<1> to MN<m> are turned on in response to a low voltage level of the main switching signal PDN_M. When the main pull-down switches MN<1> to MN<m> are turned on, the pull-down circuit 510 provides the matching resistance value MR to the connecting pad PDIO.

Figure 11D:
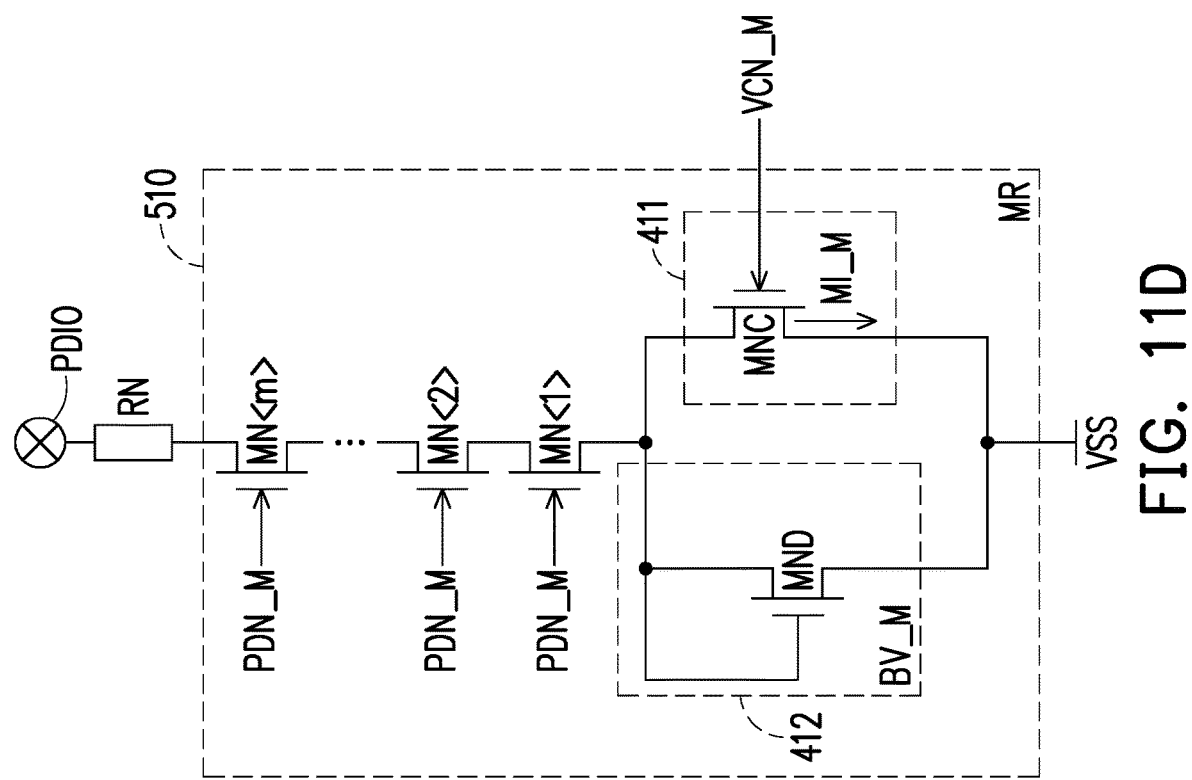

FIG. 11D illustrates a schematic diagram of a pull-down driver of an OCD according to an embodiment of the disclosure. Please refer to FIG. 11D, in the embodiment, the pull-down circuit 510 and the resistor RN. The pull-down circuit 510 includes the main current source circuit 411, the main base circuit 412 and the main pull-down switches MN<1> to MN<m>. In the embodiment, the main current source circuit 411 includes the first main transistor MNC. The main base circuit 412 includes the second main transistor MND. The configuration of the main current source circuit 411, the main base circuit 412 and the main pull-down switches MN<1> to MN<m> has been clearly explained in the embodiments of FIG. 8, FIG. 9 and FIG. 11C, so it will not be repeated here.

In the embodiment, the resistor RN is connected between the connecting pad PDIO and the pull-down circuit 510. The resistor RN is used to suppress the electrostatic discharge in the pull-down circuit 510. Besides, when the main pull-down switch MN<1> to MN<m> is turned on, the pull-down driver 510 and the resistor RN commonly provide the matching resistance value MR.

Figure 12:
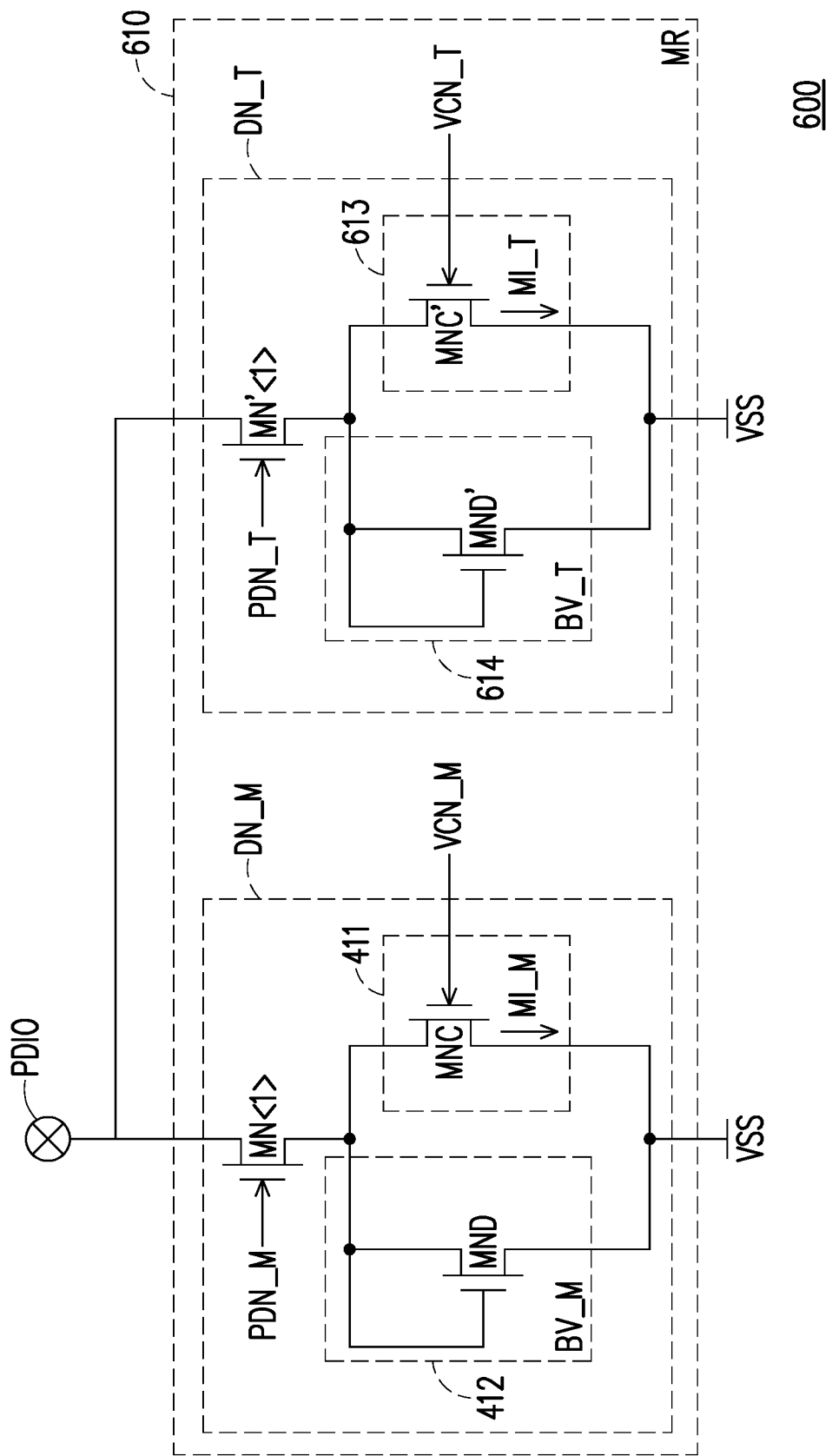
FIG. 12 illustrates a schematic diagram of a pull-down driver of an OCD according to an embodiment of the disclosure.

FIG. 12 illustrates a schematic diagram of a pull-down driver of an OCD according to an embodiment of the disclosure. Please refer to FIG. 12, in the embodiment, the pull-down circuit 610 includes the main current source circuit 411, the main base circuit 412, the main pull-down switch MN<1>, an auxiliary current source circuit 613, an auxiliary base circuit 614 and an auxiliary pull-down switch MN'<1>. The configuration of the main current source circuit 411, the main base circuit 412 and the main pull-down switch MN<1> has been clearly explained in the embodiments of FIG. 8, FIG. 9 and FIG. 11A, so it will not be repeated here. The auxiliary current source circuit 613 is connected between the connecting pad PDIO and the low reference voltage VSS. The auxiliary current source circuit 613 provides an auxiliary current value MI_T in response to an auxiliary control signal VCN_T. The matching resistance value MR is trimmed by the auxiliary current value MI_T.

In the embodiment, the auxiliary current source circuit 613 includes a first auxiliary transistor MNC'. A first terminal of the first auxiliary transistor MNC' is connected to the connecting pad PDIO through the auxiliary pull-down switch MN'<1>. A second terminal of the first auxiliary transistor MNC' is connected to the low reference voltage VSS. A control terminal of the first auxiliary transistor MNC' receives the auxiliary control signal VCN_T. The first auxiliary transistor MNC' is operated in the triode region and the saturation region based on the auxiliary control signal VCN_T and the voltage value on the connecting pad PDIO. An external system voltage is decided in a voltage range (for example, 0.5×VDD to 0.8×VDD). Therefore, based on the external system voltage, the auxiliary control signal VCN_T is adjusted according to a required current of the first auxiliary transistor MNC'. Therefore, the auxiliary control signal VCN_T is an analog signal. The first auxiliary transistor MNC' generates the main current value MI_T in response to a voltage value of the auxiliary control signal VCN_T. In the embodiment, the voltage value of the auxiliary control signal VCN_T is between the high reference voltage VDD and the low reference voltage VSS.

The auxiliary base circuit 614 includes a second auxiliary transistor MND'. A first terminal of the second auxiliary transistor MND' is connected to a control terminal of the second auxiliary transistor MND' and the first terminal of the first auxiliary transistor MNC'. A second terminal of the second auxiliary transistor MND' is connected to the second terminal of the first auxiliary transistor MNC'. The second auxiliary transistor MND' is connected between the connecting pad PDIO and the low reference voltage VSS in diode-connected manner. When the voltage value on the connecting pad PDIO is higher than a threshold voltage value of the second auxiliary transistor MND', the second auxiliary transistor MND' is operated in a saturation region. The second auxiliary transistor MND' generates the base value BV_T. In the embodiment, each of the first auxiliary transistor MNC' and the second auxiliary transistor MND' may be implemented by a N-type FET, but the disclosure is not limited thereto.

The auxiliary base circuit 614 is connected to the auxiliary current source circuit 613 in parallel. The auxiliary base circuit 614 determines an auxiliary base value BV_T of the matching resistance value. The matching resistance value MR is also trimmed by the auxiliary base value BV_T.

In some embodiments, the auxiliary base circuit 614 may be omitted.

In the embodiment, the auxiliary pull-down switch MN'<1> is connected to the auxiliary current source circuit 613, the auxiliary base circuit 614 and the connecting pad PDIO. When the auxiliary pull-down switch MN'<1> is turned on in response to a high voltage level of an auxiliary switching signal PDN_T, the auxiliary current source circuit 613 and the auxiliary base circuit 614 are connected to the connecting pad PDIO. Therefore, the matching resistance value MR is trimmed by the auxiliary base value BV_T and the auxiliary current value MI_T. When the auxiliary pull-down switch MN'<1> is turned off in response to a low voltage level of the auxiliary switching signal PDN_T, the auxiliary current source circuit 613 and the auxiliary base circuit 614 are not connected to the connecting pad PDIO. Therefore, the matching resistance value MR is not trimmed by the auxiliary base value BV_T and the auxiliary current value MI_T. In the embodiment, the auxiliary switching signal PDN_T is a digital signal.

Figure 13A:
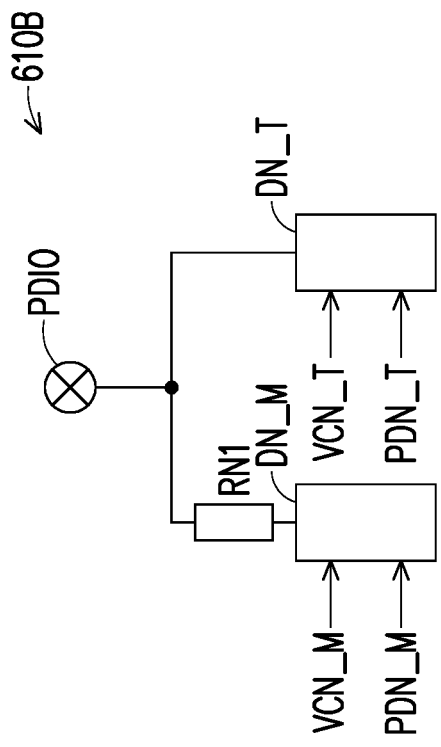
FIG. 13A to FIG. 13H illustrate a schematic diagram of a pull-down driver of an OCD according to an embodiment of the disclosure.

FIG. 13A illustrates a schematic diagram of a pull-down driver of an OCD according to an embodiment of the disclosure. Please refer to FIG. 12 and FIG. 13A, in the embodiment, in the pull-down driver 610A, the main current source circuit 411, the main base circuit 412 and the main pull-down switch MN<1> may be act as a main pull-down circuit DN_M. The auxiliary current source circuit 613, the auxiliary base circuit 614 and the auxiliary pull-down switch MP'<1> may be act as an auxiliary pull-down circuit DN_T.

Figure 13B:
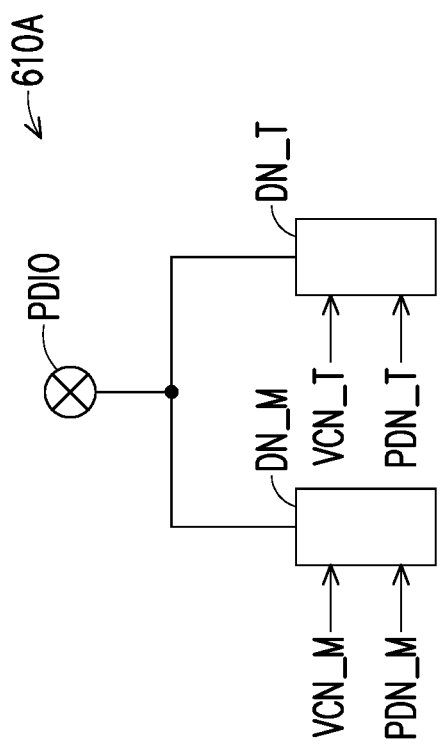

FIG. 13B illustrates a schematic diagram of a pull-down driver of an OCD according to an embodiment of the disclosure. In the embodiment, comparing to FIG. 13A, the pull-down driver 610B as shown in FIG. 13B further includes a resistor RN1. The resistor RN1 is connected between the connecting pad PDIO and the main pull-down circuit DN_M. The resistor RN1 is used to suppress an electrostatic discharge in the main pull-down circuit DN_M.

Figure 13C:
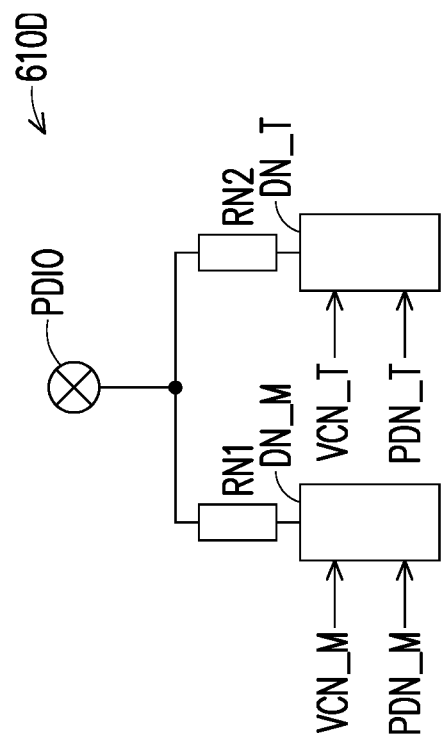

FIG. 13C illustrates a schematic diagram of a pull-down driver of an OCD according to an embodiment of the disclosure. In the embodiment, comparing to FIG. 13A, the pull-down driver 610C as shown in FIG. 13C further includes a resistor RN2. The resistor RN2 is connected between the connecting pad PDIO and the auxiliary pull-down circuit DN_T. The resistor RN2 is used to suppress an electrostatic discharge in the auxiliary pull-down circuit DN_T.

Figure 13D:
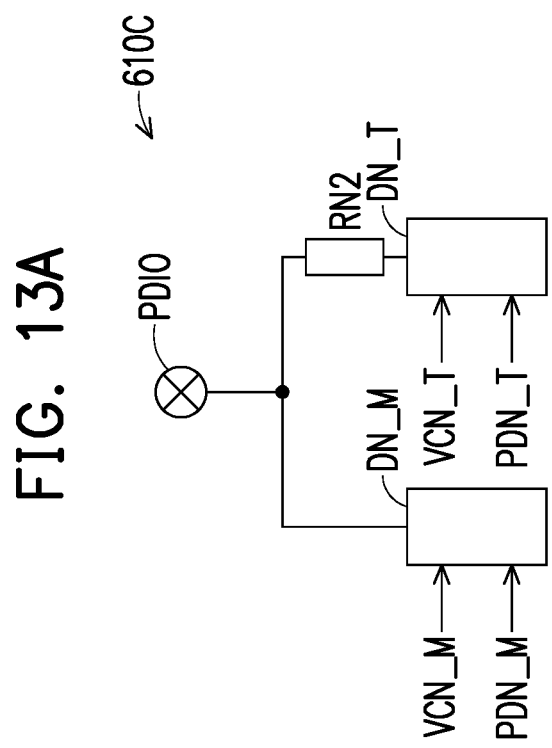

FIG. 13D illustrates a schematic diagram of a pull-down driver of an OCD according to an embodiment of the disclosure. In the embodiment, comparing to FIG. 13A, the pull-down driver 610D as shown in FIG. 13D further includes the resistors RN1, RP2. The resistor RN1 is connected between the connecting pad PDIO and the main pull-down circuit DN_M. The resistor RN1 is used to suppress an electrostatic discharge in the main pull-down circuit DN_M. The resistor RN2 is connected between the connecting pad PDIO and the auxiliary pull-down circuit DN_T. The resistor RN2 is used to suppress an electrostatic discharge in the auxiliary pull-down circuit DN_T.

Figure 13E:
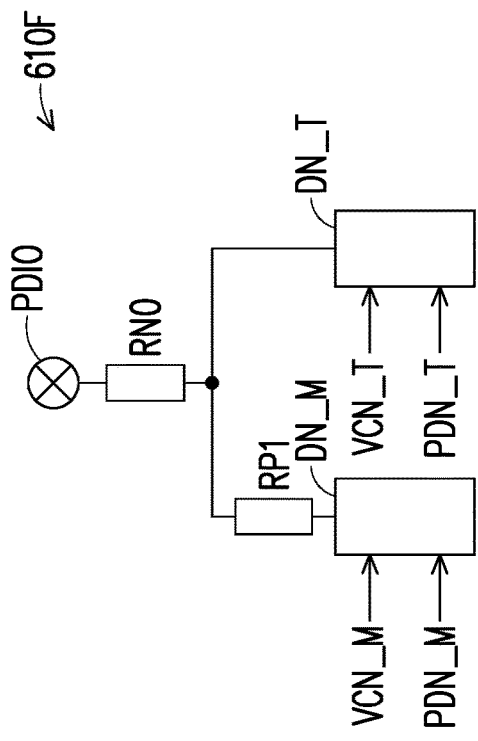

FIG. 13E illustrates a schematic diagram of a pull-down driver of an OCD according to an embodiment of the disclosure. In the embodiment, comparing to FIG. 13A, the pull-down driver 610E as shown in FIG. 13E further includes a resistor RN0. A first terminal of the resistor RN0 is connected to the auxiliary pull-down circuit DN_T and the main pull-down circuit DN_M. A second terminal of the resistor RN0 is connected to the connecting pad PDIO. The resistor RN0 is used to suppress an electrostatic discharge in the auxiliary pull-down circuit DN_T and the main pull-down circuit DN_M.

Figure 13F:
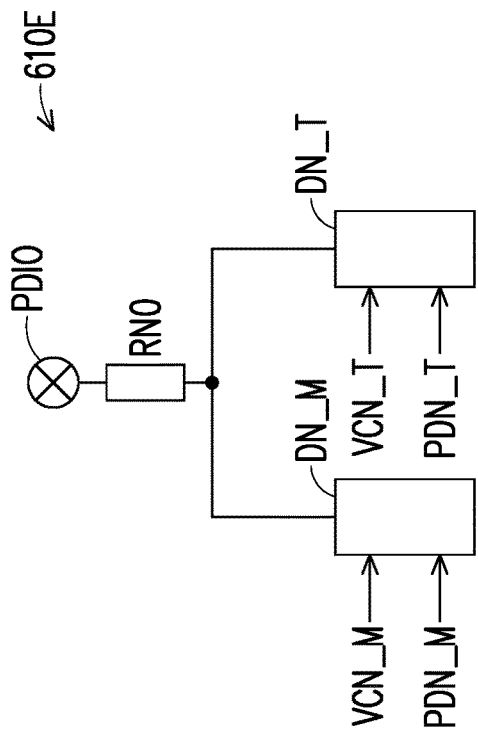

FIG. 13F illustrates a schematic diagram of a pull-down driver of an OCD according to an embodiment of the disclosure. In the embodiment, comparing to FIG. 13B, the pull-down driver 610F as shown in FIG. 13F further includes the resistor RN0.

Figure 13G:
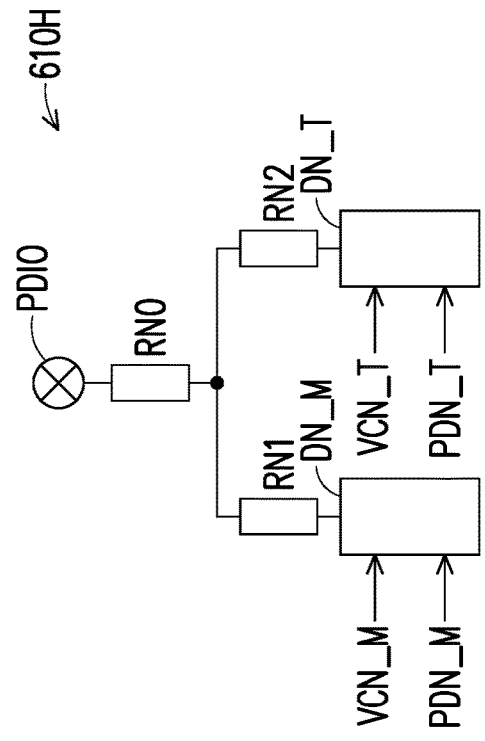

FIG. 13G illustrates a schematic diagram of a pull-down driver of an OCD according to an embodiment of the disclosure. In the embodiment, comparing to FIG. 13C, the pull-down driver 610G as shown in FIG. 13G further includes the resistor RN0.

Figure 13H:
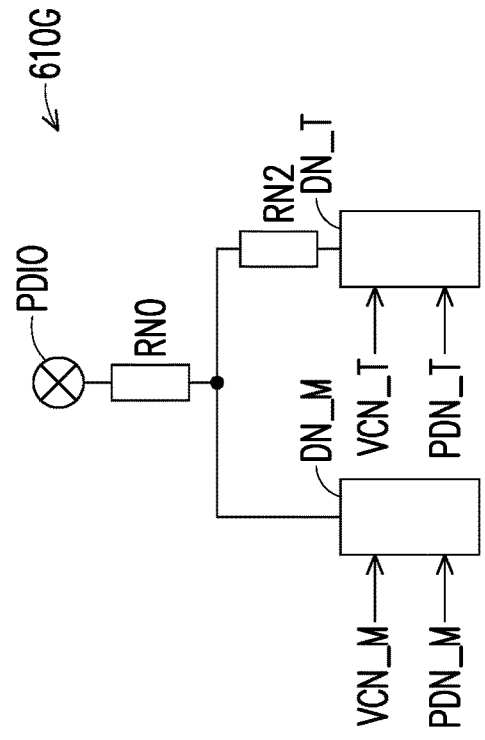

FIG. 13H illustrates a schematic diagram of a pull-down driver of an OCD according to an embodiment of the disclosure. In the embodiment, comparing to FIG. 13D, the pull-down driver 610H as shown in FIG. 13H further includes the resistor RN0.

Figure 14:
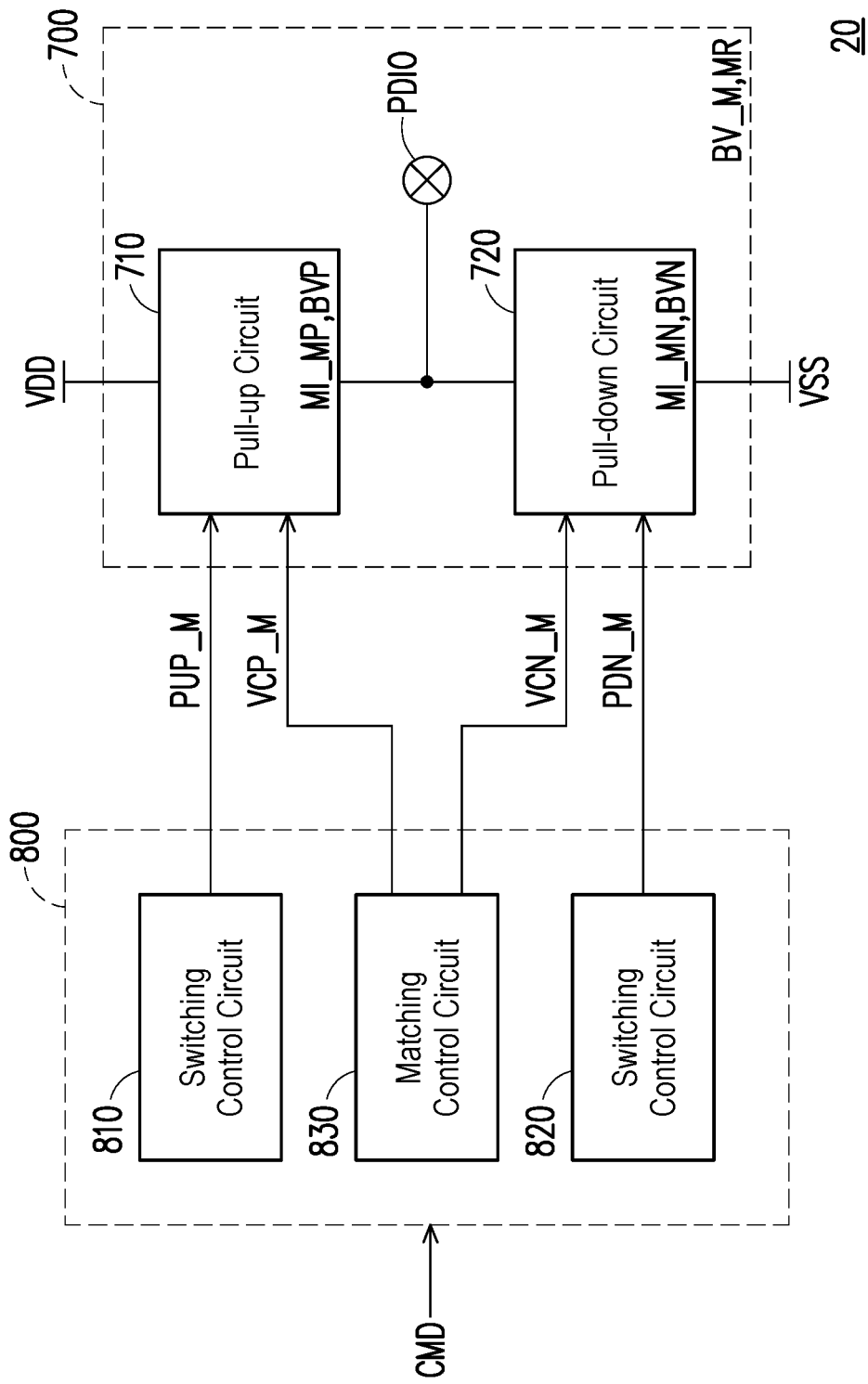
FIG. 14 illustrates a schematic diagram of an OCD according to an embodiment of the disclosure.

FIG. 14 illustrates a schematic diagram of a driving circuit according to an embodiment of the disclosure. Please refer to FIG. 14, In the embodiment, the driving circuit 20 includes an OCD 700 and a control circuit 800. The OCD 700 includes a connecting pad PDIO and a pull-up driver 710. The pull-up driver 710 is connected between the connecting pad PDIO and the high reference voltage VDD. The pull-up driver 710 provides a main current value MI_MP (that is, a main pull-up current value) in response to a main control signal VCP_M (that is, a main pull-up control signa) and determines a base value BV_MP (that is, a pull-up base value) of the matching resistance value MR, wherein the matching resistance value MR is associated with the main current value MI_MP. In the embodiment, the pull-up driver 710 may be implemented by one of the pull-up driver 110 as shown in FIG. 2, the pull-up driver 210 as shown in FIG. 5A to FIG. 5D the pull-up driver 310 as shown in FIG. 6 and pull-up driver 310A to 310H as shown in FIGS. 7A to 7H, so the pull-up driver 710 will not be repeated here. In the embodiment, the control circuit 800 is connected to the pull-up driver 710. The control circuit 800 provides the main control signal VCP_M to the pull-up driver 710 in response to a command CMD. The main control signal VCP_M is the analog signal.

The OCD 700 further includes a pull-down circuit 720. The pull-down circuit 720 is connected between the connecting pad PDIO and the low reference voltage VSS. The pull-down circuit 720 provides a main current value MI_MN (that is, a main pull-down current value) in response to a main control signal VCN_M (that is, a main pull-down control signa) and determines a base value BV_MN (that is, a pull-down base value) of the matching resistance value MR. In the embodiment, the pull-down circuit 720 may be implemented by one of the pull-down circuit 410 as shown in FIG. 8, the pull-down circuit 510 as shown in FIG. 11A to FIG. 11D, the pull-down circuit 610 as shown in FIG. 12 and pull-down driver 610A to 610H as shown in FIGS. 7A to 7H, so the pull-down circuit 720 will not be repeated here. In the embodiment, the control circuit 800 is connected to the pull-down circuit 720. The control circuit 800 provides the main control signal VCN_M to the pull-down circuit 720 in response to the command CMD. The main control signal VCN_M is the analog signal.

In the embodiment, the base value BV_M is determined by the base values BVP, BVN. The matching resistance value MR is adjusted from the base value BV_M according to the main current values MI_MP, MI_MN.

For example, the pull-up driver 710 may be implemented by the pull-up driver 210 as shown in FIG. 5A. The pull-down circuit 720 may be implemented by the pull-down circuit 510 as shown in FIG. 11A. Thus, the control circuit 800 provides the main switching signal PUP_M to the pull-up driver 710, and provides the main switching signal PDN_M to the pull-down circuit 720. Each of the main switching signals PUP_M, PDN_M is the digital signal.

In the embodiment, the control circuit 800 includes a switching control circuits 810, 820 and a matching control circuit 830. When the command CMD is an adjusting command (for example, ZQ calibration command, slew rate adjusting command or duty adjusting command), the matching control circuit 830 provides the main control signal VCP_M to the pull-up driver 710 and provides the main control signal VCN_M to the pull-down circuit 720. Thus, the pull-up driver 710 generates a first equivalent resistance value the main current value MI_MP and the base value BV_MP. The pull-down circuit 720 generates a second equivalent resistance value according to the main current value MI_MN and the base value BV_MN. Besides, the switching control circuits 810 provides the main switching signals PUP_M to the pull-up driver 710. The switching control circuits 820 provides the main switching signals PUP_M to the pull-down circuit 720. Thus, the first equivalent resistance value and the second equivalent resistance value are provided to the connecting pad PDIO. The matching resistance value MR on the connecting pad PDIO is determined.

In some embodiments, based on the requirement, one of the pull-up driver 710 and the pull-down circuit 720 may be omitted. For example, if the pull-down circuit 720 is omitted, the OCD 700 provides the matching resistance value MR and adjusts the matching resistance value MR from the base value BV_MP according to the main current value MI_MP. For example, if the pull-up driver 710 is omitted, the OCD 700 provides the matching resistance value MR and adjusts the matching resistance value MR from the base value BV_MN according to the main current value MI_MN.

In view of the foregoing, the OCD provides the matching resistance value and adjusts the matching resistance value from the base value according to the main current value. Therefore, the OCD and the driving circuit provide the matching resistance value having wide range. Besides, the OCD and the driving circuit provide the matching resistance value having wide range. A number of parallel connections of pull-up drivers and/or pull-down circuits could be decreased. Thus, the OCD and the driving circuit have the low capacitance value on the connecting pad.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A pull-up driver of an off-chip driver for providing a matching resistance value, comprising:
   a main current source circuit, connected between a connecting pad and a high reference voltage, and configured to provide a main current value in response to a main control signal, wherein the matching resistance value is associated with the main current value;
   a main base circuit, connected to the main current source circuit in parallel, and configured to determine a base value of the matching resistance value, and
   a main pull-up switch, connected to the main current source circuit, the main base circuit and the connecting pad, and configured to connect the main current source circuit and the main base circuit to the connecting pad in response to a main switching signal.

2. The pull-up driver of claim 1, wherein the main current source circuit comprises:
   a first main transistor, a first terminal of the first main transistor is connected to the high reference voltage, a second terminal of the first main transistor is connected to the connecting pad, a control terminal of the first main transistor receives the main control signal.

3. The pull-up driver of claim 2, wherein the main base circuit comprises:
   a second main transistor, a first terminal of the second main transistor is connected to the first terminal of the first main transistor, a second terminal of the second main transistor is connected to a control terminal of the second main transistor and the second terminal of the first main transistor.

4. The pull-up driver of claim 3, wherein the second main transistor is operated in a saturation region.

5. The pull-up driver of claim 2, wherein the first main transistor is operated in a triode region.

6. The pull-up driver of claim 1, further comprising:
   a resistor, wherein the pull-up driver is connected to the connecting pad through the resistor, so as to suppress an electrostatic discharge in the pull-up driver.

7. The pull-up driver of claim 1, wherein the pull-up driver further comprises:
   an auxiliary current source circuit, connected between the connecting pad and the high reference voltage, configured to provide an auxiliary current value in response to an auxiliary control signal, wherein the matching resistance value is trimmed by the auxiliary current value.

* * * * *